(12) United States Patent
Kusano et al.

(10) Patent No.: US 10,923,774 B2
(45) Date of Patent: Feb. 16, 2021

(54) BATTERY STATE ESTIMATING DEVICE AND POWER SUPPLY DEVICE

(71) Applicant: DENSO CORPORATION, Kariya (JP)

(72) Inventors: Yoshikazu Kusano, Kariya (JP); Koji Ohira, Kariya (JP); Naomi Awano, Kariya (JP)

(73) Assignee: DENSO CORPORATION, Kariya (JP)

( * ) Notice: Subject to any disclaimer, the term of this patent is extended or adjusted under 35 U.S.C. 154(b) by 413 days.

(21) Appl. No.: 15/914,312

(22) Filed: Mar. 7, 2018

(65) Prior Publication Data

US 2018/0261889 A1    Sep. 13, 2018

(30) Foreign Application Priority Data

Mar. 7, 2017 (JP) ............................ JP2017-042794
Dec. 22, 2017 (JP) ............................ JP2017-246746

(51) Int. Cl.
| | |
|---|---|
| *H01M 10/44* | (2006.01) |
| *H01M 10/48* | (2006.01) |
| *H01M 10/42* | (2006.01) |
| *G01R 31/36* | (2020.01) |
| *G01R 19/165* | (2006.01) |
| *G01R 31/3828* | (2019.01) |
| *G01R 31/3842* | (2019.01) |
| *G01R 31/374* | (2019.01) |

(52) U.S. Cl.
CPC .. *H01M 10/4285* (2013.01); *G01R 19/16542* (2013.01); *G01R 31/3648* (2013.01); *G01R 31/374* (2019.01); *G01R 31/3828* (2019.01); *G01R 31/3842* (2019.01); *H01M 10/44* (2013.01); *H01M 10/48* (2013.01)

(58) Field of Classification Search
CPC .. H01M 10/4285; H01M 10/44; H01M 10/48; G01R 31/3648; G01R 31/374; G01R 31/3828; G01R 19/16542; G01R 31/3842; Y02E 60/10
See application file for complete search history.

(56) References Cited

U.S. PATENT DOCUMENTS

| | | | |
|---|---|---|---|
| 2006/0076929 A1* | 4/2006 | Tatsumi | G01R 31/367 320/132 |
| 2010/0085057 A1 | 4/2010 | Nishi et al. | |
| 2011/0156713 A1 | 6/2011 | Akamine et al. | |
| 2011/0199059 A1* | 8/2011 | Aradachi | H02J 7/0031 320/162 |

(Continued)

FOREIGN PATENT DOCUMENTS

| | | |
|---|---|---|
| JP | 2013-130504 A | 7/2013 |
| JP | 2015-102344 A | 6/2015 |

*Primary Examiner* — Mohamed Charioui
(74) *Attorney, Agent, or Firm* — Oliff PLC

(57) ABSTRACT

A battery state estimating device estimates a battery state in a battery module having a plurality of secondary batteries. The battery state estimating device is configured to be able to change a number of targets which is a number of the secondary batteries subject to estimation of the battery state of the secondary battery based on a specific value acquired from the plurality of secondary batteries, or the battery state estimating device is configured to be able to change a calculation formula for estimating the battery state of the battery to a calculation formula with a small calculation load.

13 Claims, 19 Drawing Sheets

(56) References Cited

U.S. PATENT DOCUMENTS

2014/0084867 A1\* 3/2014 Hamaoka .............. H02J 7/0016
320/116
2016/0091573 A1 3/2016 Shiraishi et al.
2016/0097816 A1\* 4/2016 Li ........................ G01R 31/367
702/63

\* cited by examiner

BATTERY STATE ESTIMATING DEVICE AND POWER SUPPLY DEVICE

CROSS-REFERENCE TO RELATED APPLICATION

This application is based on and claims the benefit of priority from earlier Japanese Patent Applications No. 2017-42794 filed Mar. 7, 2017, and No. 2017-246746 filed Dec. 22, 2017, the descriptions of which are incorporated herein by reference.

TECHNICAL FIELD

The present disclosure relates to a battery state estimating device and a power supply device.

BACKGROUND

Conventionally, a state of charge (SOC) is estimated in a battery module including a plurality of secondary batteries.

Japanese Patent Application Laid-Open Publication No. 2008-243373 (Patent Document 1) discloses a configuration in which the SOC is estimated by obtaining an electromotive force of a secondary battery by estimating a polarization voltage during charge/discharge of the secondary battery from a charge/discharge current flowing through the secondary battery and the temperature of the secondary battery, and from a battery voltage of the secondary battery and the estimated polarization voltage.

With such a configuration, since the temperature is taken into account for estimating the polarization voltage of the secondary battery, it is possible to estimate the SOC with high accuracy.

However, since the number of secondary batteries constituting the battery module is very large in a PHV (Plug-in Hybrid Vehicle), an EV (Electric Vehicle) and the like, variations in the battery characteristics of the secondary batteries tend to occur.

If it is attempted to estimate the battery state of such a battery module with high accuracy by applying the configuration disclosed in Patent Document 1, it is necessary to perform calculations for each secondary battery in consideration of variations in battery characteristics of the secondary batteries.

As a result, a calculation load becomes large in a battery module having a large number of secondary batteries, and an increase in power consumption and heat generation in a computing section becomes a problem.

SUMMARY

An embodiment provides a battery state estimating device capable of estimating a battery state of a battery module having a large number of secondary batteries with high accuracy and with low power consumption.

One aspect of the present disclosure is a battery state estimating device including battery module, and a plurality of secondary batteries in the battery module, a battery state estimating device configured to estimate a battery state of the battery module, and the battery state estimating device is configured to be able to change a number of targets which is a number of the secondary batteries subject to estimation of the battery state of the secondary battery based on a specific value acquired from the plurality of secondary batteries, or the battery state estimating device is configured to be able to change a calculation formula for estimating the battery state of the battery to a calculation formula with a small calculation load.

The battery state estimating device is configured to be able to change the number of targets for estimating the battery state of a plurality of secondary batteries based on the specific value acquired from the secondary battery or configured to be able to change the calculation formula for the estimation to a calculation formula with little calculation load.

As a result, it is possible to control the battery state estimating device so as to reduce the electrical power consumed for the calculation while maintaining the calculation precision.

As described above, according to the present disclosure, it is possible to provide a battery state estimating device capable of estimating the battery state of the battery module having a large number of secondary batteries with high accuracy and with low power consumption.

DETAILED DESCRIPTION OF THE PREFERRED EMBODIMENTS

First Embodiment

An embodiment of a battery state estimating device will be described with reference to FIGS. 1 to 3.

Figure 1:
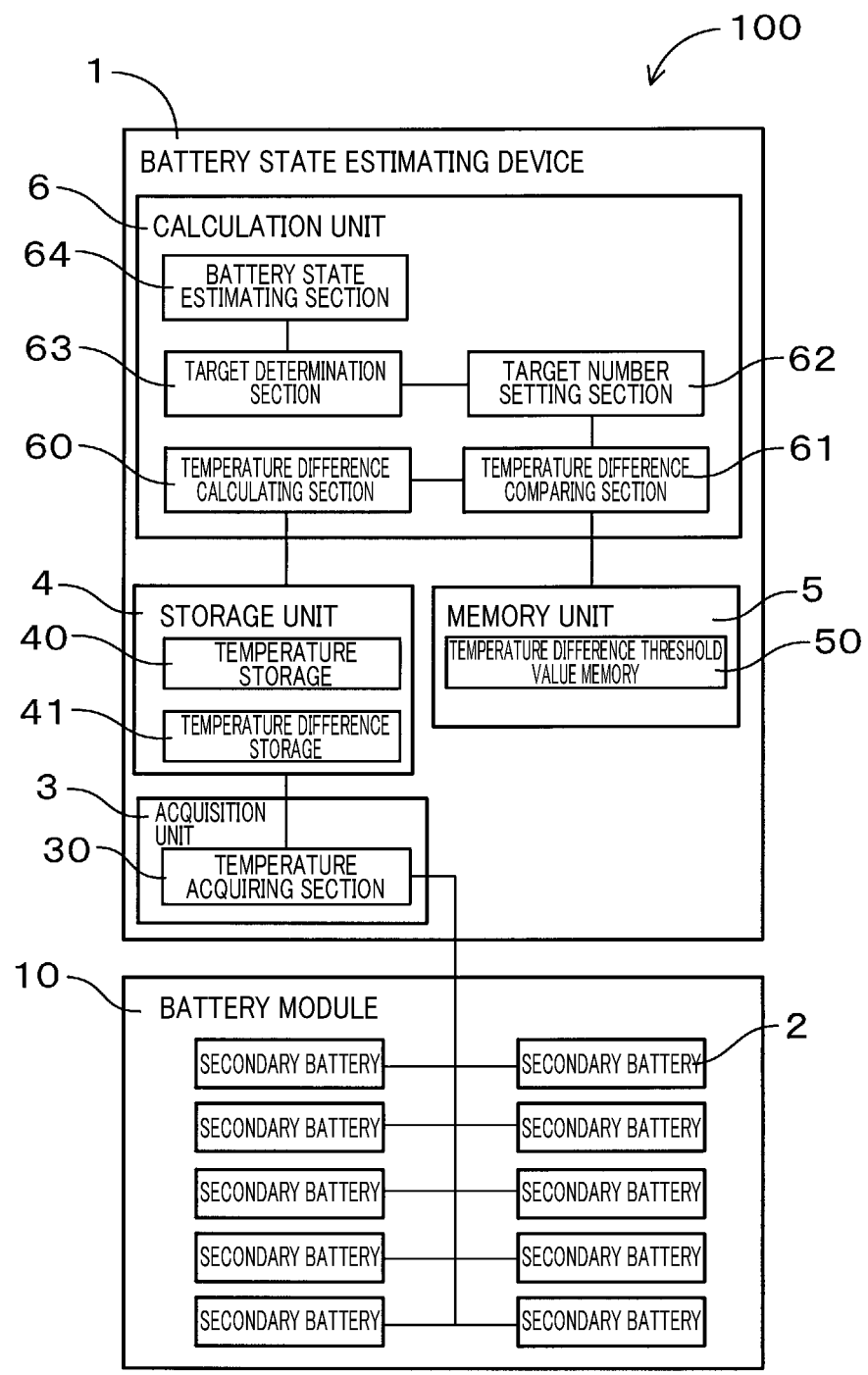
FIG. 1 shows a block diagram of a configuration of a battery state estimating device in a first embodiment.

As shown in FIG. 1, a battery state estimating device 1 of the present embodiment estimates a battery state in a battery module 10 having a plurality of secondary batteries 2.

The battery state estimating device 1 is configured to be capable of changing a calculation amount for estimating the battery state of the secondary batteries 2 based on a specific value acquired from the plurality of secondary batteries 2.

Hereinafter, the battery state estimating device 1 of the present embodiment will be described in detail.

The battery state estimating device 1 shown in FIG. 1 is for estimating the battery state of the secondary battery 2 mounted on a battery control section in a vehicle such as an electric vehicle.

The plurality of secondary batteries 2 are provided to constitute the battery module 10.

Ten secondary batteries 2 are provided in the battery module 10 of the present embodiment.

The battery module 10 may have a configuration including a plurality of cell blocks formed of a plurality of secondary batteries.

The battery module 10 and the battery state estimating device 1 constitute a power supply device 100.

As shown in FIG. 1, the battery state estimating device 1 includes an acquisition unit 3, a storage unit 4, a memory unit 5, and a calculation unit 6.

The acquisition unit 3 includes a temperature acquiring section 30 that acquires temperatures of the plurality of secondary batteries 2.

The temperature acquiring section 30 is formed of a temperature sensor, and is connected to the secondary batteries 2 to detect the temperature of the secondary batteries 2.

Timing for acquiring the temperature is not particularly limited, and it may be performed always or at predetermined intervals.

Note that when the battery module 10 has a plurality of cell blocks formed of a plurality of secondary batteries 2, the temperature acquiring section 30 may acquire the temperature of the cell block detected by the temperature sensor provided for each cell block as the temperature of the secondary batteries.

As shown in FIG. 1, the storage unit 4 has a temperature storage 40 and a temperature difference storage 41.

The temperature storage 40 is composed of a rewritable nonvolatile memory, and stores the temperatures of the plurality of secondary batteries 2 acquired by the temperature acquiring section 30.

The temperature difference storage 41 is also composed of a rewritable nonvolatile memory, and stores the temperature difference calculated by a temperature difference calculating section 60 (described later).

As shown in FIG. 1, the memory unit 5 has a temperature difference threshold value memory 50.

The temperature difference threshold value memory 50 is composed of a non-rewritable nonvolatile memory, and at least one temperature difference threshold value is stored in advance.

In a case where a plurality of temperature difference threshold values are stored, the plurality of temperature difference threshold values may constitute a predetermined relational formula or map.

Figure 2:
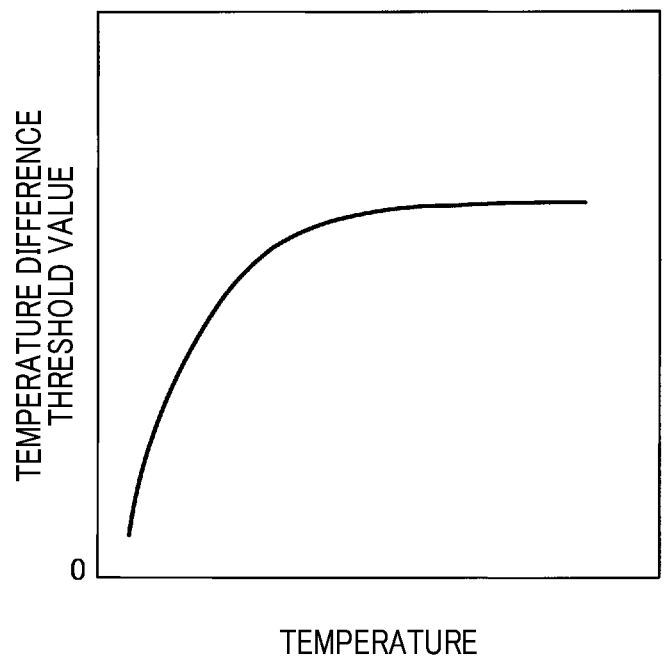
FIG. 2 shows a conceptual diagram of a relationship between a temperature difference threshold and the temperature in the first embodiment.

As shown in FIG. 2, a plurality of temperature difference threshold values are stored in the temperature difference threshold value memory 50 constituting a map defined by the temperature of the secondary battery 2 in the present embodiment.

As shown in FIG. 1, the calculation unit 6 includes the temperature difference calculating section 60, a temperature difference comparing section 61, a target number setting section 62, a target determination section 63, and a battery state estimating section 64.

The calculation unit 6 is configured to be capable of executing a program that functions as the temperature difference calculating section 60, the temperature difference comparing section 61, the target number setting section 62, the target determination section 63, and the battery state estimating section 64.

The program is stored in a memory (not shown) provided in the calculation unit 6.

The temperature difference calculating section 60 calculates a temperature difference in the plurality of secondary batteries 2 as a specific value.

In the present embodiment, the temperature difference is the difference between the maximum temperature and the minimum temperature at the predetermined timing of the plurality of secondary batteries 2 stored in the temperature storage 40.

Note that when the battery module 10 has the plurality of cell blocks formed of the plurality of secondary batteries 2, the temperature difference at the temperature of the cell block stored in the temperature storage 40 may be calculated as the temperature difference in the plurality of secondary batteries 2.

The calculated temperature difference is stored in the temperature difference storage 41.

The temperature difference comparing section 61 shown in FIG. 1 extracts the temperature difference stored in the temperature difference storage 41 and also extracts the temperature difference threshold value stored in the temperature difference threshold value memory 50 and both are compared.

The extraction of the temperature difference threshold value in the temperature difference threshold value memory 50 can be performed based on the temperature stored in the temperature storage 40, and in the present embodiment, for example, when the difference threshold value shown in FIG. 2 constitutes a map in the temperature difference threshold value memory 50, a predetermined temperature difference threshold value can be extracted from the temperature stored in the temperature storage 40.

Then, the temperature difference comparing section 61 compares the extracted temperature difference threshold value with the temperature difference stored in the temperature difference storage 41.

In the present embodiment, the temperature difference comparing section 61 compares the temperature difference extracted from the temperature storage 40 with the temperature difference threshold value, and indicates a size difference relation between the temperature difference and the temperature difference threshold value as a comparison result.

The target number setting section 62 shown in FIG. 1 sets the number of targets, which is the number of secondary batteries 2 estimated by the battery state estimating section 64 described later, based on the comparison result calculated by the temperature difference comparing section 61.

In the present embodiment, when the comparison result calculated by the temperature difference comparing section 61 indicates that the temperature difference is smaller than the temperature difference threshold value, the target number setting section 62 reduces the number of targets.

On the other hand, when the comparison result calculated by the temperature difference comparing section 61 indicates that the temperature difference is not smaller than the temperature difference threshold value, the target number setting section 62 maintains the current target number without reducing the number of targets.

Then, the target determining section 63 determines the secondary battery 2 to be an estimation target based on the target number set by the target number setting section 62.

For example, the determination of the estimation target may be made as follows.

Among the plurality of secondary batteries 2, those having poor battery characteristics can be extracted and used as estimation targets, and those having good battery characteristics can be excluded.

For example, batteries having low temperature acquired by the temperature acquiring section 30, batteries having a high input/output resistance, batteries having a remaining battery level away from the median value, etc., from all the secondary batteries 2 are extracted and set as estimation targets, and the others may be excluded.

Thereafter, the battery state estimating section 64 estimates the battery state of the secondary battery 2 to be the estimation target, which is determined by the target determining section 63.

The state of the battery estimated by the battery state estimating section 64 is not particularly limited, and it is possible to estimate a state of charge (SOC), an input/output power, chargeable and dischargeable electric energy, an input/output resistance, and the like in the secondary battery 2.

Next, a use mode of the battery state estimating device 1 will be described with reference to a flowchart shown in FIG. 3.

Figure 3:
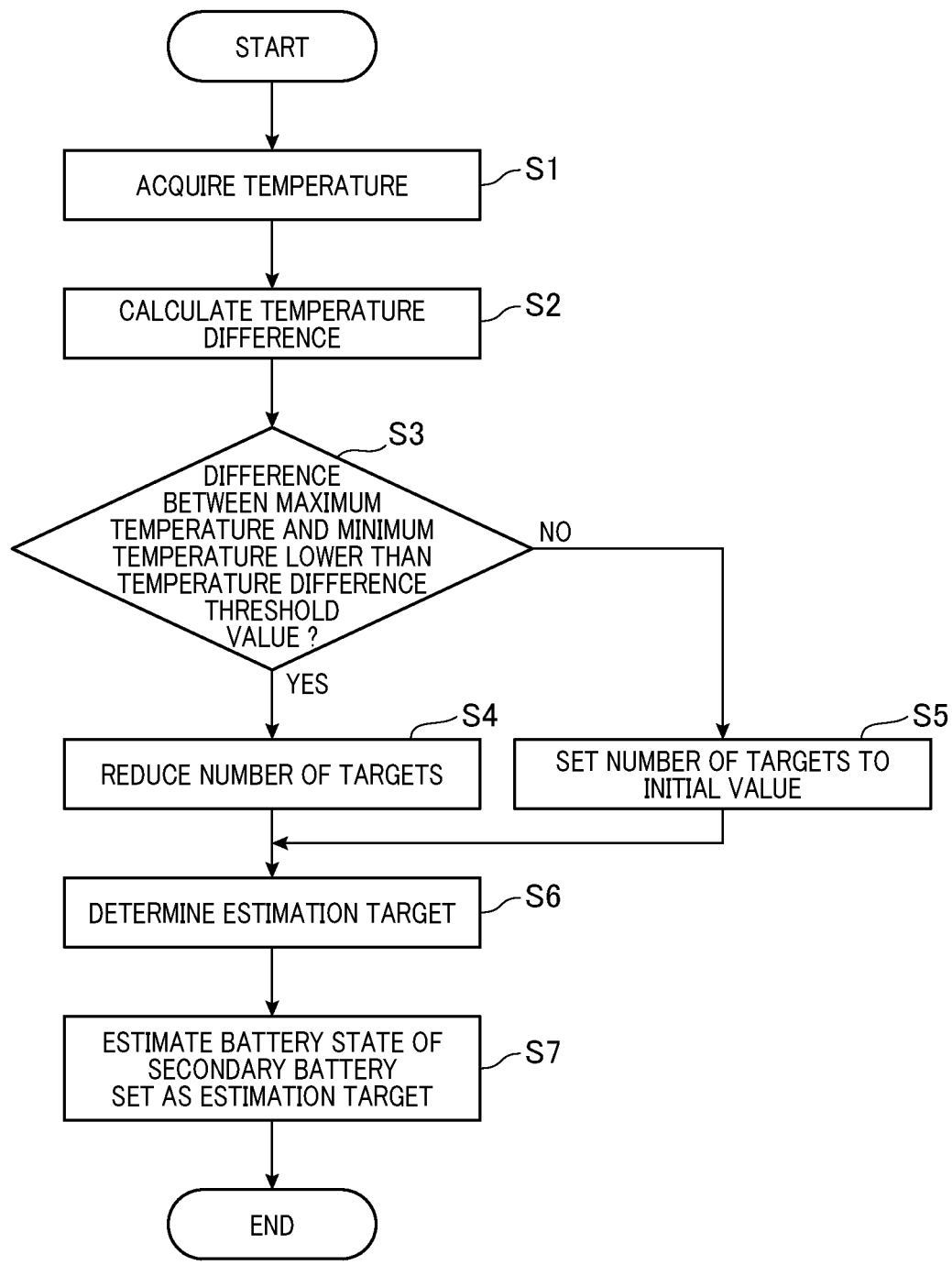
FIG. 3 shows a flowchart of a control mode of the battery state estimating device in the first embodiment.

First, as shown in FIG. 3, in step S1, the temperature acquiring section 30 acquires the temperature of the secondary battery 2.

Then, the acquired temperature is stored in the temperature storage 40.

The temperature acquiring section 30 always acquires the temperature of the secondary battery 2 in the present embodiment.

Then, in step S2, the temperature difference calculating section 60 calculates a temperature difference, which is a difference between the highest temperature and the lowest temperature, from the temperatures of all the secondary batteries 2 stored in the temperature storage 40.

Then, the calculated temperature difference is stored in the temperature difference storage 41.

Thereafter, as shown in FIG. 3, in step S3, first, the temperature difference comparing section 61 extracts the temperature difference stored in the temperature difference storage 41 and the temperature difference threshold value stored in the temperature difference threshold value memory 50.

In the present embodiment, the temperature difference threshold value is extracted from the map of the temperature difference threshold value shown in FIG. 2 based on the temperature stored in the temperature storage 40.

Then, the extracted temperature difference and the temperature difference threshold value are compared.

The temperature difference comparing section 61 indicates a size difference relation between the temperature difference and the temperature difference threshold value as a comparison result.

Then, if it is determined in step S3 that the comparison result calculated by the temperature difference comparing section 61 indicates that the temperature difference is smaller than the temperature difference threshold value, the process proceeds to Yes in step S3, and in step S4, the target number setting section 62 reduces the number of targets.

On the other hand, if the comparison result calculated by the temperature difference comparing section 61 indicates that the temperature difference is not smaller than the temperature difference threshold value in step S3, the process proceeds to No in step S3, and in step S5, the target number setting section 62 does not reduce the number of targets, and sets the number of targets as an initial value.

Then, after step S4 or step S5, in step S6, the target determining section 63 determines a secondary battery 2 to be the estimation target.

In the present embodiment, in a case of after the execution of step S4, the target determining section 63 sets a secondary battery 2 having a low temperature as the estimation target.

On the other hand, in a case of after step S5, all the secondary batteries 2 are set as the estimation targets.

Thereafter, in step S7, the battery state estimating section 64 estimates the battery state of the secondary battery 2 set as the estimation target in the target determining section 63, and ends the process.

Next, functions and effects of the battery state estimating device 1 of the present embodiment will be described in detail.

According to the battery state estimating device 1, it is configured to be able to change the number of targets for estimating the battery state of the plurality of secondary batteries based on the specific value acquired from the secondary battery 2.

As a result, it is possible to control the battery state estimating device so as to reduce the electrical power consumed for the calculation while maintaining the calculation precision.

Further, in the present embodiment, the specific value is configured to be calculated based on the temperature of the secondary battery 2.

Thereby, since the specific value reflects the battery state of the secondary battery 2 reliably, it is possible to appropriately change the calculation amount according to the battery state of the secondary battery 2.

As a result, it is possible to reduce the electrical power consumed for the calculation while maintaining the calculation precision.

In addition, in the present embodiment, the battery state estimating device 1 includes the temperature acquiring section 30 that acquires the temperatures of at least two secondary batteries 2, the temperature difference calculating section 60 that calculates the temperature difference of at least two temperatures acquired by the temperature acquiring section 30 as a specific value, the temperature difference comparing section 61 that compares the temperature difference calculated by the temperature difference calculating section 60 with a preset temperature difference threshold value, the target number setting section 62 that sets the number of targets which is the number of secondary batteries 2 of which the battery states to be estimated, and the battery state estimating section 64 that estimates battery states in secondary batteries corresponding to the number of targets set by the target number setting section 62.

Accordingly, even when the battery module 10 has a large number of secondary batteries 2, since the estimation target is set after setting the number of targets in consideration of the temperature of the secondary battery 2, it is possible to control processing so as to reduce the power consumption for calculation while maintaining the calculation accuracy.

Further, in the present embodiment, the target number setting section 62 reduces the number of targets when the comparison result calculated by the temperature difference comparing section 61 indicates that the temperature difference calculated by the temperature difference calculating section 60 is smaller than the temperature difference threshold value.

When the variation in the temperature is small in the plurality of secondary batteries 2, the variation of the battery states in the secondary batteries 2 also becomes small.

Therefore, in the battery module 10 including the plurality of secondary batteries 2, the calculation amount and the power consumption can be reduced while maintaining the estimation accuracy by reducing the estimation target of the battery state when the temperature difference is smaller than the temperature difference threshold value.

Further, in the present embodiment, there is provided the temperature difference threshold value memory 50 in which a plurality of temperature difference threshold values are stored in advance, and the temperature difference comparing section 61 extracts the temperature difference threshold value based on any one of at least two temperatures acquired by the temperature acquiring section 30, and the extracted temperature difference threshold value is compared with the temperature difference calculated by the temperature difference calculating section 60.

A progress of a change in the battery state of the secondary battery 2 differs depending on the temperature.

Therefore, the degree of variation of the battery state in the plurality of secondary batteries 2 also differs depending on the temperature of each secondary battery 2.

Therefore, by using a configuration as described above in the present embodiment, since the temperature difference threshold value that compares the temperature difference in the plurality of secondary batteries 2 is also considering the temperature of the secondary battery 2, it is possible to extract the temperature difference threshold value corresponding to the variation of the battery state.

As a result, number of estimation targets of the battery state can be reduced when the variation in the battery state of the secondary battery 2 is small, and the calculation amount and the power consumption can be reduced while maintaining the estimation accuracy.

Further, the power supply device 100 includes the above-described battery state estimating device 1 and the battery module 10 having ten or more secondary batteries 2 configured to estimate the battery state by the battery state estimating device 1 in the present embodiment.

Since the power supply device 100 has a large number of secondary batteries 2, it is possible to greatly reduce the amount of calculation and the power consumption while maintaining the estimation accuracy by estimating the battery state by the battery state estimating device 1.

As described above, according to the present embodiment, it is possible to provide the battery state estimating device 1 capable of estimating the battery state of the battery module 10 having a large number of secondary batteries 2 with high accuracy and with low power consumption.

Second Embodiment

Figure 4:
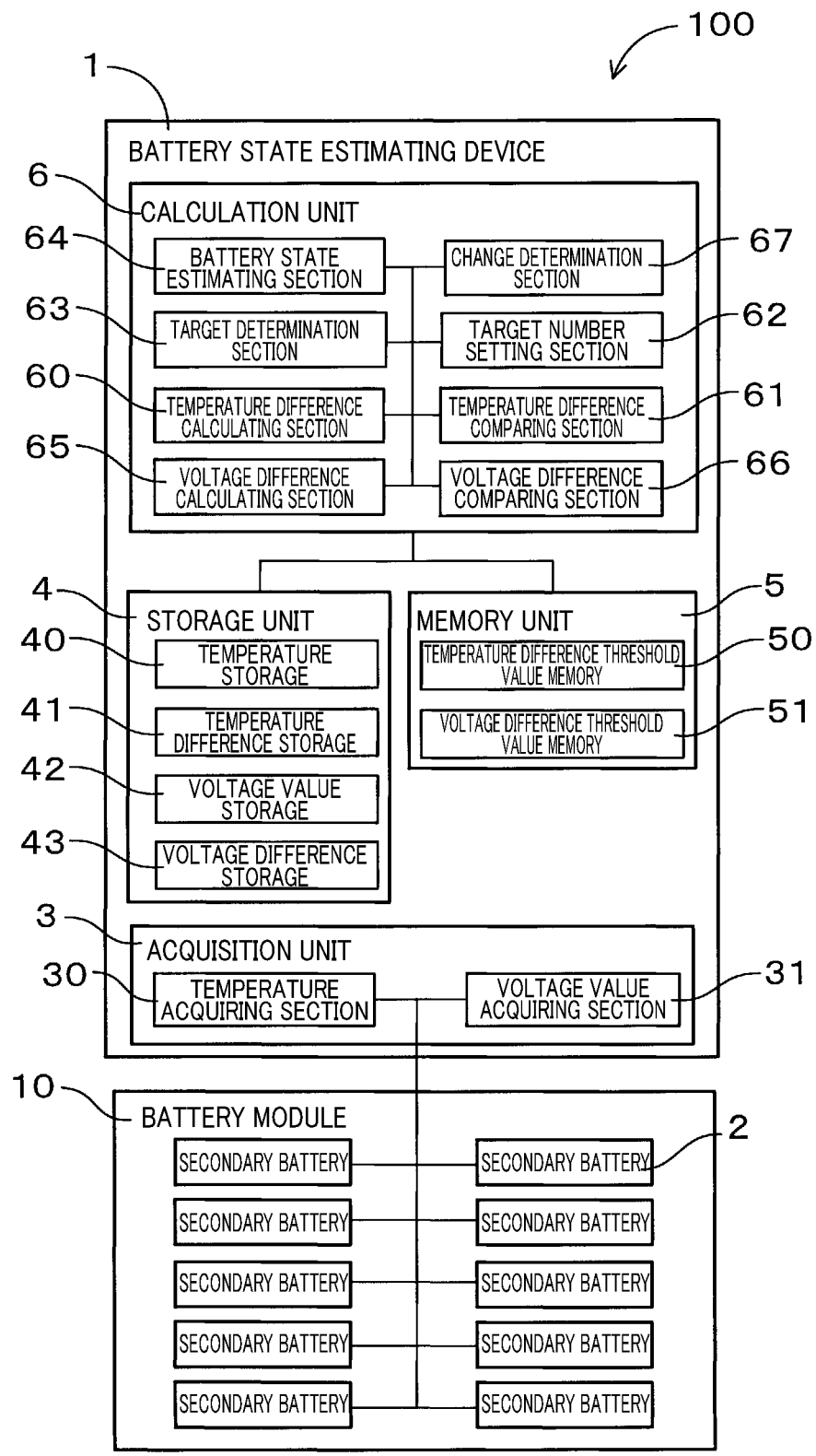
FIG. 4 shows a block diagram of a configuration of a battery state estimating device in a second embodiment.

In a battery state estimating device 1 of a second embodiment, as shown in FIG. 4, the acquisition unit 3 further includes a voltage value acquiring section 31, the storage 4 further includes a voltage value storage 42 and a voltage difference storage 43, the memory unit 5 further includes a voltage difference threshold value memory 51, and the calculation unit 6 further includes a voltage difference calculating section 65, a voltage difference comparing section 66, and a change determination section 67 in addition to the configuration of the first embodiment shown in FIG. 1.

Other constituent elements are the same as those in the first embodiment, and the same reference numerals as those in the first embodiment are also used in the present embodiment, and the description thereof is omitted.

The voltage value acquiring section 31 shown in FIG. 4 is configured to acquire a terminal voltage of the secondary battery 2.

The voltage value storage 42 is composed of a rewritable nonvolatile memory, and stores a voltage value acquired by the voltage value acquiring section 31.

The voltage difference calculating section 65 shown in FIG. 4 calculates a voltage difference between terminal voltages of the plurality of secondary batteries 2.

The voltage difference is a difference between the maximum and the minimum of the terminal voltages of the plurality of secondary batteries 2 at the predetermined timing stored in the voltage value storage 42.

The calculated voltage difference is stored in the voltage difference storage 43.

Note that when the battery module 10 has the plurality of cell blocks formed of the plurality of secondary batteries 2, the voltage difference within the cell block stored in the voltage difference storage 43 may be calculated as the voltage difference in the plurality of secondary batteries 2.

In the voltage difference threshold value memory 51 shown in FIG. 4, a voltage difference threshold value as a reference value of a voltage value used in the change determining section 67 (described later) is stored in advance.

The voltage difference threshold value can be appropriately set according to a configuration of the secondary battery 2 and the like that can be the estimation target.

The voltage difference comparing section 66 shown in FIG. 4 compares the voltage difference calculated by the voltage difference calculating section 65 with a preset voltage difference threshold value.

In the present embodiment, the voltage difference comparing section 66 compares the voltage difference extracted from the voltage difference storage 43 with the voltage difference threshold value extracted from the voltage difference threshold value memory 51, and indicates a size difference relation between the voltage difference and the voltage difference threshold value as a comparison result.

The change determination section 67 shown in FIG. 4 determines whether or not to change the target number based on the comparison result of the voltage difference comparing section 66.

In the present embodiment, it is determined to change the number of targets when the voltage difference is larger than the voltage difference threshold value, and if not, the number of targets is not changed.

Then, the target number setting section 62 changes the number of targets based on the determination result of the change determination section 67.

Next, a use mode of the battery state estimating device 1 according to the second embodiment will be described with reference to a flowchart shown in FIG. 5.

Figure 5:
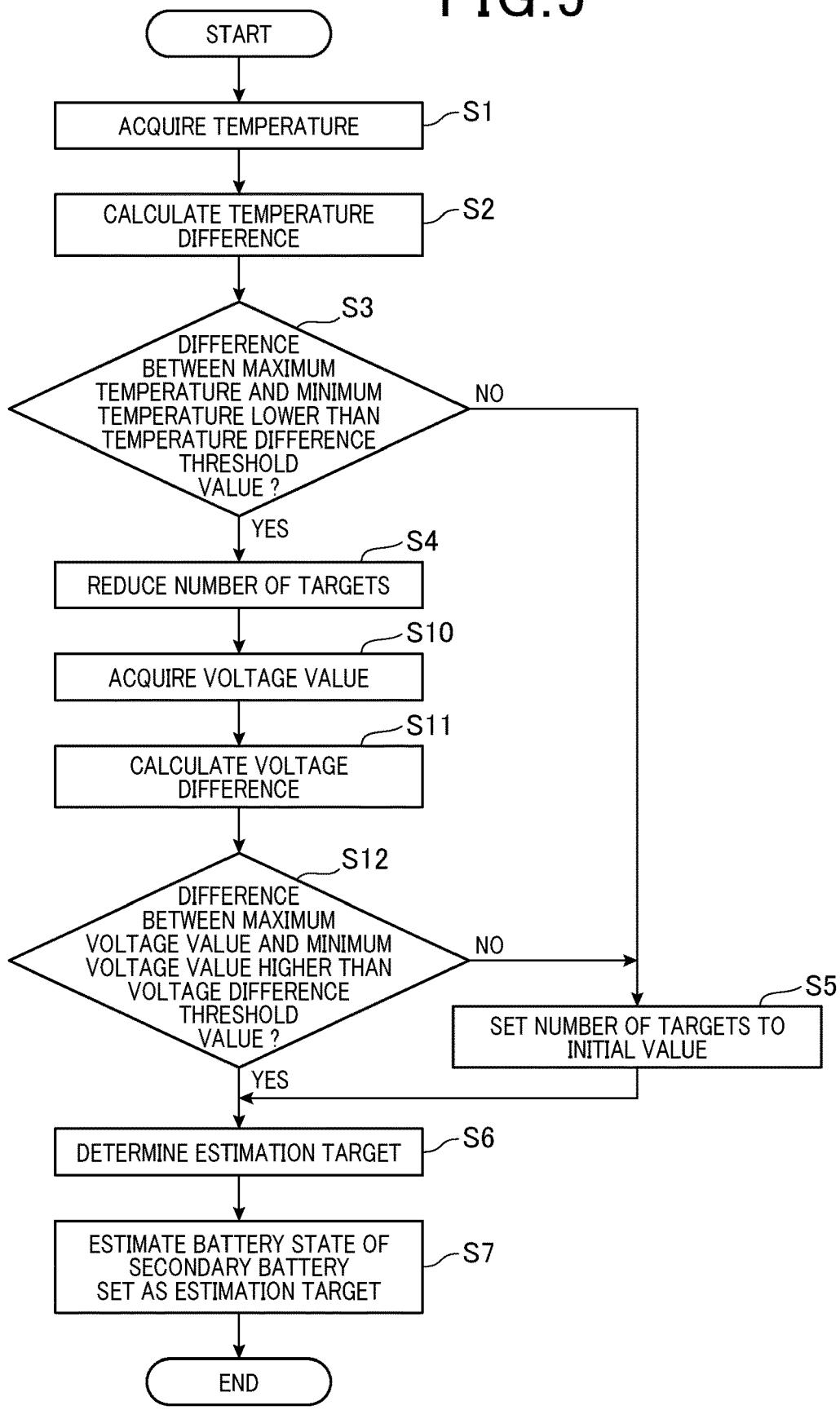
FIG. 5 shows a flowchart of a control mode of the battery state estimating device in the second embodiment.

First, as in the case of the first embodiment shown in FIG. 3, steps S1 to S4 are carried out as shown in FIG. 5.

After step S4, in step S10, the voltage value acquiring section 31 acquires the terminal voltages of all the secondary batteries 2 and stores them in the voltage value storage 42.

Then, in step S11, the voltage difference calculating section 65 calculates the voltage difference, which is the difference between the highest voltage value and the lowest voltage value from the voltage values of all the secondary batteries 2 stored in the voltage value storage 42, and stores the voltage difference in the voltage difference storage 43.

Thereafter, in step S12, the voltage difference comparing section 66 extracts the voltage difference stored in the voltage difference storage 43 and the voltage difference threshold value stored in the voltage difference threshold value memory 51, and both are compared.

Then, the voltage difference comparing section 66 indicates the size difference relationship between the voltage difference and the voltage difference threshold value as the comparison result.

Then, if the comparison result of the voltage difference comparing section 66 indicates that the voltage difference is larger than the voltage difference threshold value in step S12, the process proceeds to Yes in step S12, and in step S5, the reduced target number is set to an initial value, then steps S6 and S7 are carried out.

On the other hand, if the comparison result of the voltage difference comparing section 66 indicates that the voltage difference is not larger than the voltage difference threshold value in step S12, the process proceeds to No in step S12, then, steps S6 and S7 are carried out without changing the number of targets.

According to the battery state estimating device 1 of the second embodiment, when the variations in the terminal voltages of the secondary batteries 2 are excessively large, the estimation target number is returned to the initial value, that is, all the secondary batteries 2.

As a result, when the variations in the terminal voltages of the secondary batteries 2 are excessively large, state changes of the secondary batteries 2 are large, and the estimation accuracy can be increased by increasing the number of targets accordingly.

Note that although the number of targets is returned to the initial value in the present embodiment, the number of targets is not limited to this, and the number of targets may be increased to a predetermined number.

Even in the present embodiment, the same functions and effects as those of the first embodiment are obtained.

Third Embodiment

Figure 6:
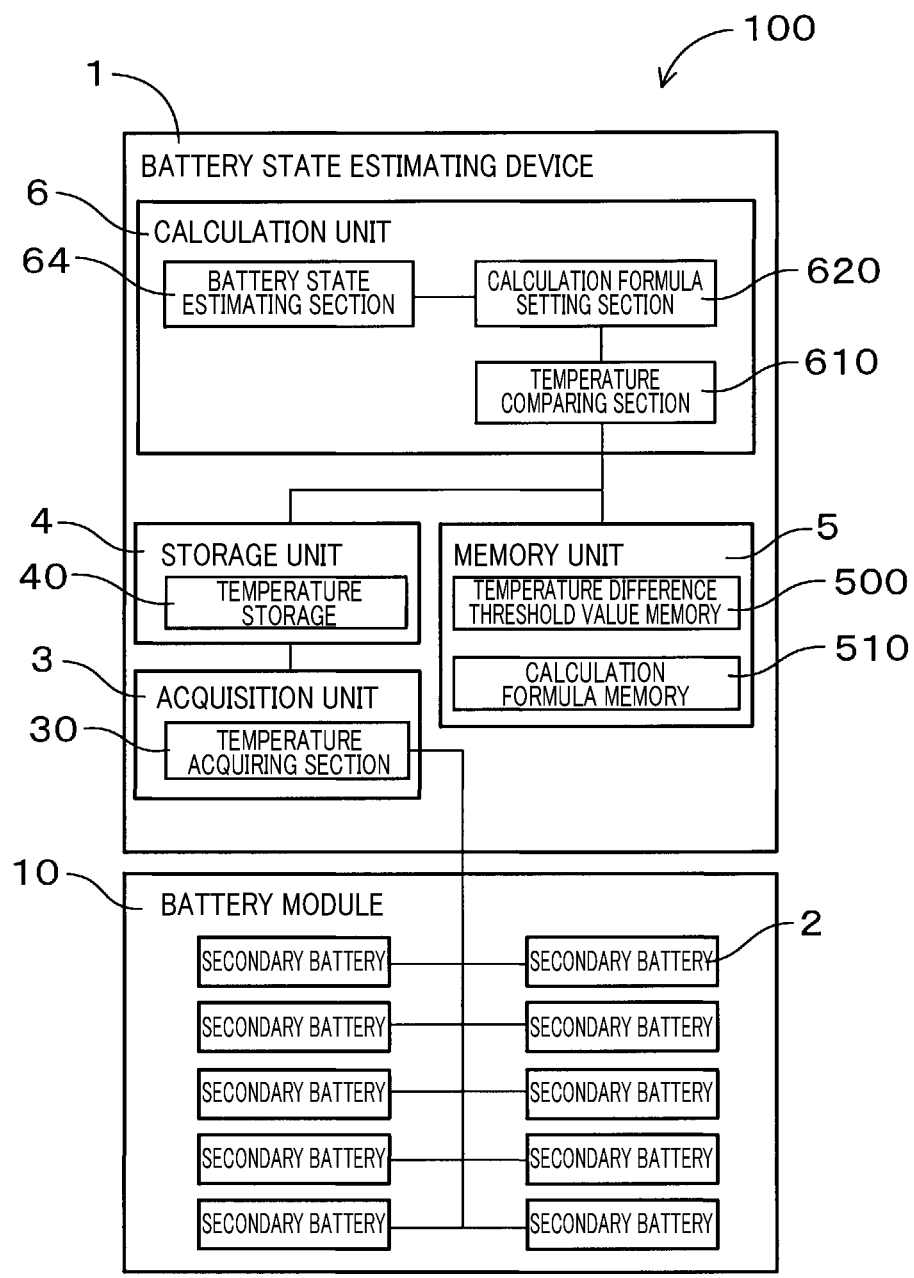
FIG. 6 shows a block diagram of a configuration of a battery state estimating device in a third embodiment.

In a battery state estimating device 1 of a third embodiment, the battery state estimating device 1 is provided with a temperature threshold value memory 500, a calculation formula memory 510, a temperature comparing section 610, and a calculation formula setting section 620 shown in FIG. 6 in place of the temperature difference storage 41, the temperature difference threshold value memory 50, the temperature difference calculating section 60, the temperature difference comparing section 61, the target number setting section 62 and the target determination section 63 of the first embodiment shown in FIG. 1.

Then, the temperature acquiring section 30 acquires the temperature of the secondary battery 2 as a specific value, and stores the acquired temperature in the temperature storage 40 in the present embodiment.

Other constituent elements are the same as those in the first embodiment and the same reference numerals as those in the first embodiment are also used in the present embodiment, and the description thereof is omitted.

In the temperature threshold value memory 500 shown in FIG. 6, a temperature threshold value is stored in advance.

The temperature threshold value can be appropriately set based on a configuration of the secondary battery 2 and the like.

For example, the temperature threshold can be set to 25° C. in view of a change in an input/output resistance in the secondary battery 2.

The temperature comparing section 610 shown in FIG. 6 compares the temperature acquired by the temperature acquiring section 30 with the preset temperature threshold value.

The temperature acquired by the temperature acquiring section 30 is extracted from the temperature storage 40.

Further, the temperature threshold value is extracted from the temperature threshold value memory 500.

The temperature comparing section 610 indicates a size difference relationship between the temperature and the temperature threshold value as a comparison result.

The calculation formula memory 510 stores a calculation formula used for estimating the battery state in the battery state estimating section 64.

A form of the calculation formula stored in the calculation formula memory 510 is not particularly limited, and it may be a relational formula for estimating the battery state, a function, or a map.

A plurality of calculation formulas with different calculation loads are stored in the calculation formula memory 510.

Examples of the calculation formula include, for example, a theoretical formula having a large calculation load based on the theoretical model, an approximate formula approximately representing a part or all of the theoretical formula represented by a function with a small calculation load, maps with small calculation load derived under a specific condition from the theoretical formula, or the like.

The calculation formula setting section 620 sets a calculation formula for estimating the battery state based on the comparison result of the temperature comparing section 610.

The calculation formula is extracted from the calculation formula memory 510 by the calculation formula setting section 620.

For example, when the comparison result of the temperature comparing section 610 indicates that the temperature is higher than the temperature threshold value, the calculation formula setting section 620 extracts a calculation formula with a small calculation load from the calculation formula memory 510, and sets this calculation formula as a calculation formula for estimating the battery state.

When the comparison result of the temperature comparing section 610 indicates that the temperature is not higher than the temperature threshold value, the calculation formula setting section 620 extracts a calculation formula not having a small calculation load from the calculation formula memory 510, and sets this calculation formula as a calculation formula for estimating the battery state.

Next, a use mode of the battery state estimating device 1 of the present embodiment will be described with reference to a flowchart shown in FIG. 7.

Figure 7:
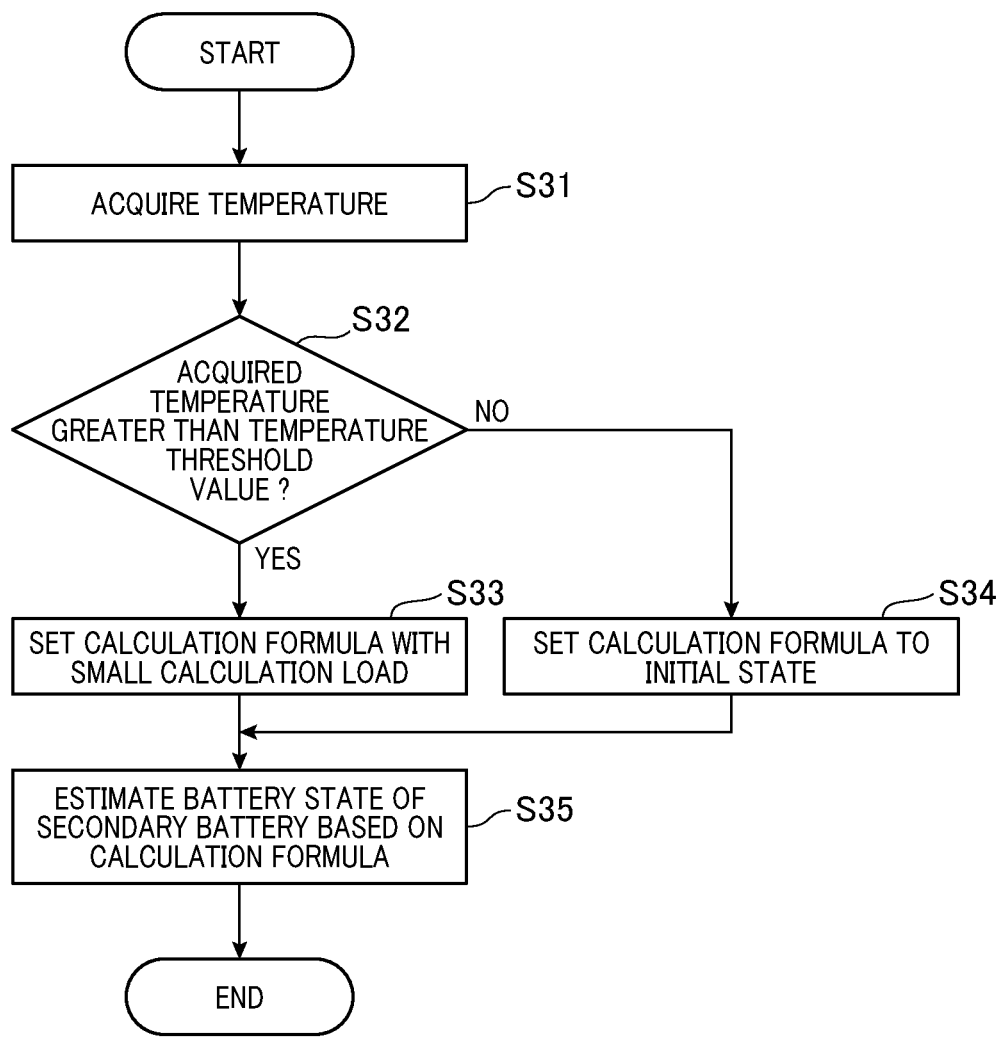
FIG. 7 shows a flowchart of a control mode of the battery state estimating device in the third embodiment.

First, as shown in FIG. 7, in step S31, the temperature acquiring section 30 acquires the temperatures of all the secondary batteries 2 as specific values.

Then, the acquired temperatures are stored in the temperature storage 40.

In the present embodiment, the temperature acquiring section 30 always acquires the temperature of the secondary battery 2.

Then, in step S32, first, the temperature comparing section 610 extracts the temperature stored in the temperature storage 40 and extracts the temperature threshold value stored in the temperature threshold value memory 500.

Then, the temperature comparing section 610 compares the extracted temperature and temperature threshold value, and indicates the size difference relation between the extracted temperature and the temperature threshold value as the comparison result.

Then, if the comparison result of the temperature comparing section 610 indicates that the extracted temperature is higher than the temperature threshold value in step S32, the process proceeds to Yes in step S32, and in step S33, the calculation formula setting section 620 extracts a calculation formula with a small calculation load from the calculation formula memory 510 and sets this calculation formula as a calculation formula for estimating the battery state.

On the other hand, if the comparison result of the temperature comparing section 610 indicates that the extracted temperature is not larger than the temperature threshold in step S32, the process proceeds to No in step S32, and in step S34, the calculation formula setting section 620 extracts a calculation formula in an initial state from the calculation formula memory 510 and set this calculation formula as a calculation formula for estimating the battery state.

Incidentally, the calculation formula in the initial state has a relatively large calculation load.

Then, after step S33 and step S34, in step S35, the battery state estimating section 64 estimates the battery state of all the secondary batteries 2 based on the set calculation formula, and ends the process.

Functions and effects of the battery state estimating device 1 of the present embodiment will be described in detail below.

When the temperature of the secondary battery 2 is high, the input/output resistance of the secondary battery 2 becomes relatively small, and the state change of the secondary battery is small.

Therefore, according to the battery state estimating device 1 of the present embodiment, the battery state is estimated using a calculation formula with a small calculation load when the temperature of the secondary battery 2 as the specific value is larger than the temperature threshold value.

Thereby, it is possible to reduce the power consumption while maintaining the estimation accuracy by suppressing the estimation accuracy from deteriorating by using the calculation formula with the small calculation load when there is little change in the battery state.

Fourth Embodiment

Figure 8:
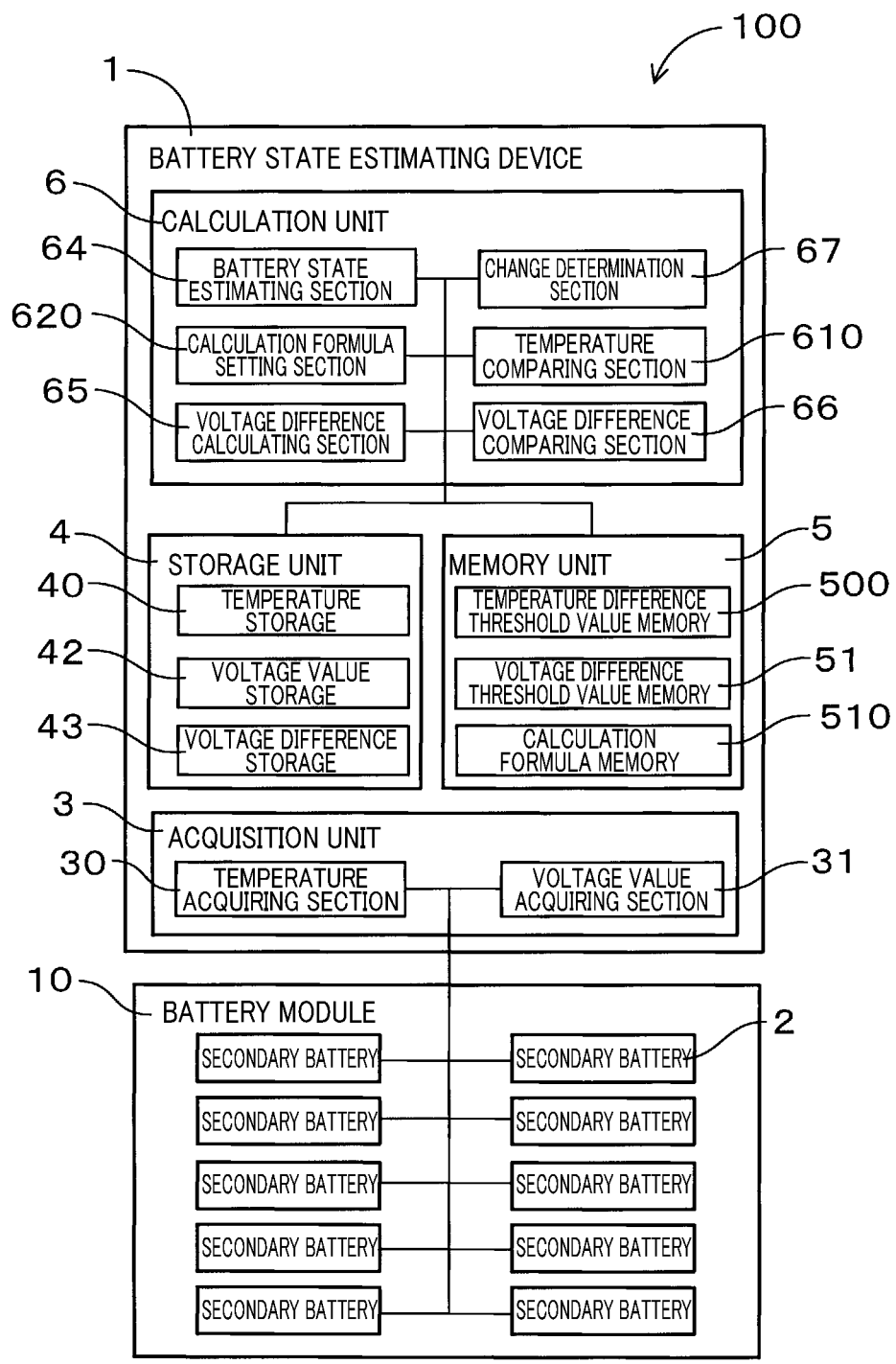
FIG. 8 shows a block diagram of a configuration of a battery state estimating device in a fourth embodiment.

In a battery state estimating device 1 of a fourth embodiment, in addition to the configuration of the third embodiment shown in FIG. 6, the battery state estimating device 1, as shown in FIG. 8, further includes the voltage value acquiring section 31, the voltage value storage 42, the voltage difference storage 43, the voltage difference threshold value memory 51, the voltage difference calculating section 65, the voltage difference comparing section 66, and the change determination section 67 of the second embodiment.

Other constituent elements are the same as those in the first, second and third embodiments and the same reference numerals as those in the first, second and third embodiments are also used in the present embodiment, and description thereof is omitted.

In the present embodiment, in place of the case of the second embodiment, the change determination section 67 shown in FIG. 8 determines whether or not to change the setting of the calculation formula based on the comparison result of the voltage difference comparing section 66.

In the present embodiment, when the voltage difference is larger than the voltage difference threshold value, it is determined to change the setting of the calculation formula, and if not, the setting of the calculation formula is determined not to be changed.

Then, the calculation formula setting section 620 shown in FIG. 8 changes the number of targets based on the determination result of the change determination section 67.

Next, a use mode of the battery state estimating device 1 according to the fourth embodiment will be described with reference to a flowchart shown in FIG. 9.

Figure 9:
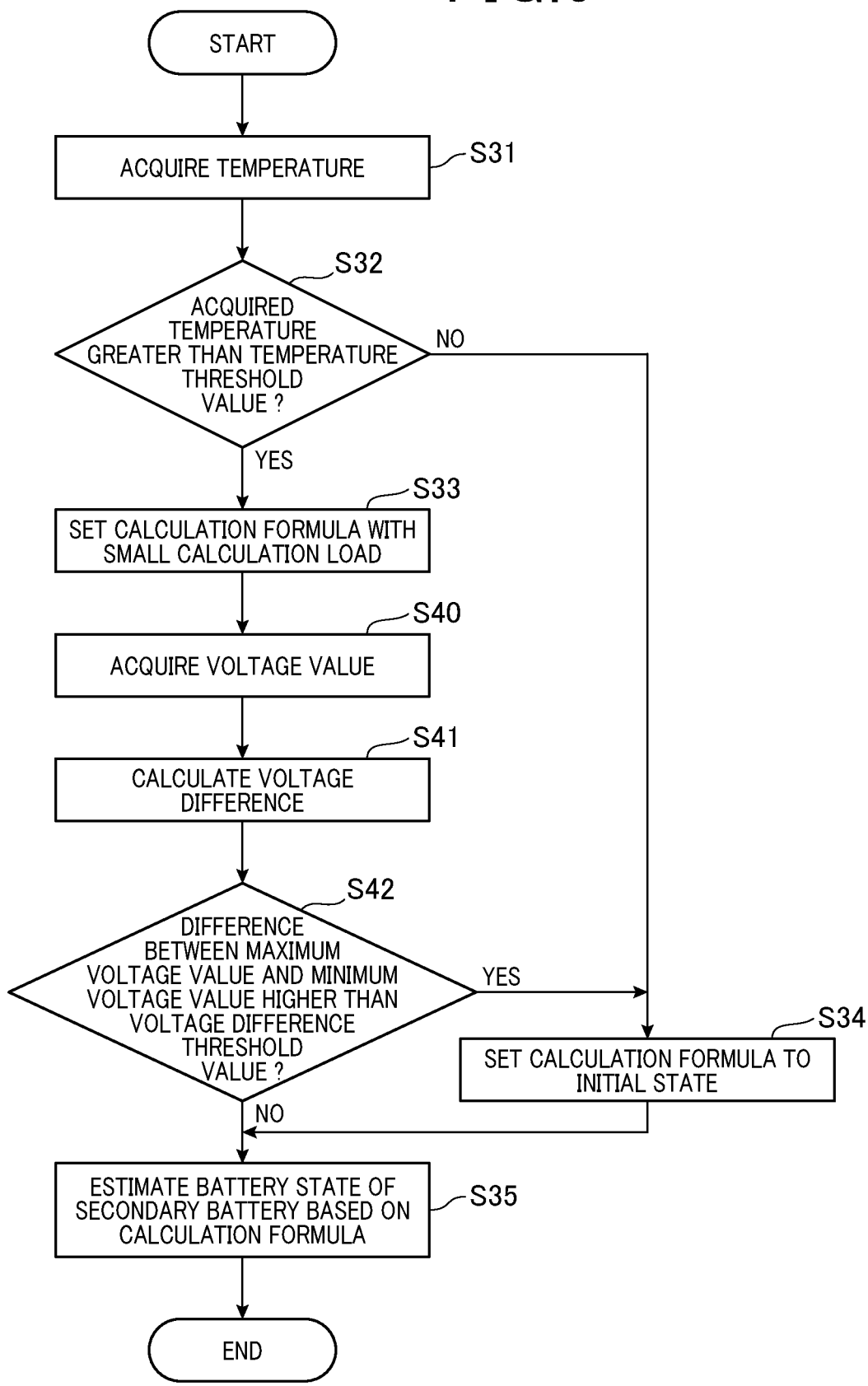
FIG. 9 shows a flowchart of a control mode of the battery state estimating device in the fourth embodiment.

First, as in the case of the third embodiment shown in FIG. 7, steps S31 to S34 are carried out as shown in FIG. 9.

After step S33, in step S40, the voltage value acquiring section 31 acquires the terminal voltages of all the secondary batteries 2 and stores them in the voltage value storage 42.

Then, in step S41, the voltage difference calculating section 65 calculates a voltage difference, which is a difference between the highest voltage value and the lowest voltage value, from the voltage values of all the secondary batteries 2 stored in the voltage value storage 42, and stores the voltage difference in the voltage difference storage 43.

Thereafter, in step S42 shown in FIG. 9, the voltage difference comparing section 66 extracts the voltage difference stored in the voltage difference storage 43 and the voltage difference threshold value stored in the voltage difference threshold value memory 51, and both are compared.

Then, the voltage difference comparing section 66 indicates a size difference relationship between the voltage difference and the voltage difference threshold value as a comparison result.

Then, as shown in FIG. 9, if the comparison result of the voltage difference comparing section 66 indicates that the voltage difference is larger than the voltage difference threshold value, the process proceeds to Yes in step S42, and in step S34, the calculation formula with a small calculation load set in step S33 is changed to a calculation formula with a high calculation load in the initial state, and set this calculation formula as the calculation formula used for estimating the battery state.

Thereafter, step S35 is carried out and ends the process.

On the other hand, if the comparison result of the voltage difference comparing section 66 indicates that the voltage difference is not larger than the voltage difference threshold value in step S42, the process proceeds to No in step S42, and step S35 is carried out to end the control.

According to the battery state estimating device 1 of the fourth embodiment, when the variation in the terminal voltage of the secondary battery 2 is excessively large, the calculation formula used for estimating the battery state is returned to the calculation formula with a large calculation load in the initial state.

Accordingly, when the variation in the terminal voltage of the secondary battery 2 is excessively large, the state change of the secondary battery 2 is large, and in accordance therewith, the estimation accuracy is raised by using the calculation formula with a large calculation load.

Note that although the calculation formula is returned to the initial state in the present embodiment, the calculation formula is not limited to this, and may be changed to a calculation formula with more calculation load as long as it is a calculation formula with high estimation accuracy.

Even in the present embodiment, the same functions and effects as those in the third embodiment can be obtained.

Fifth Embodiment

Figure 10:
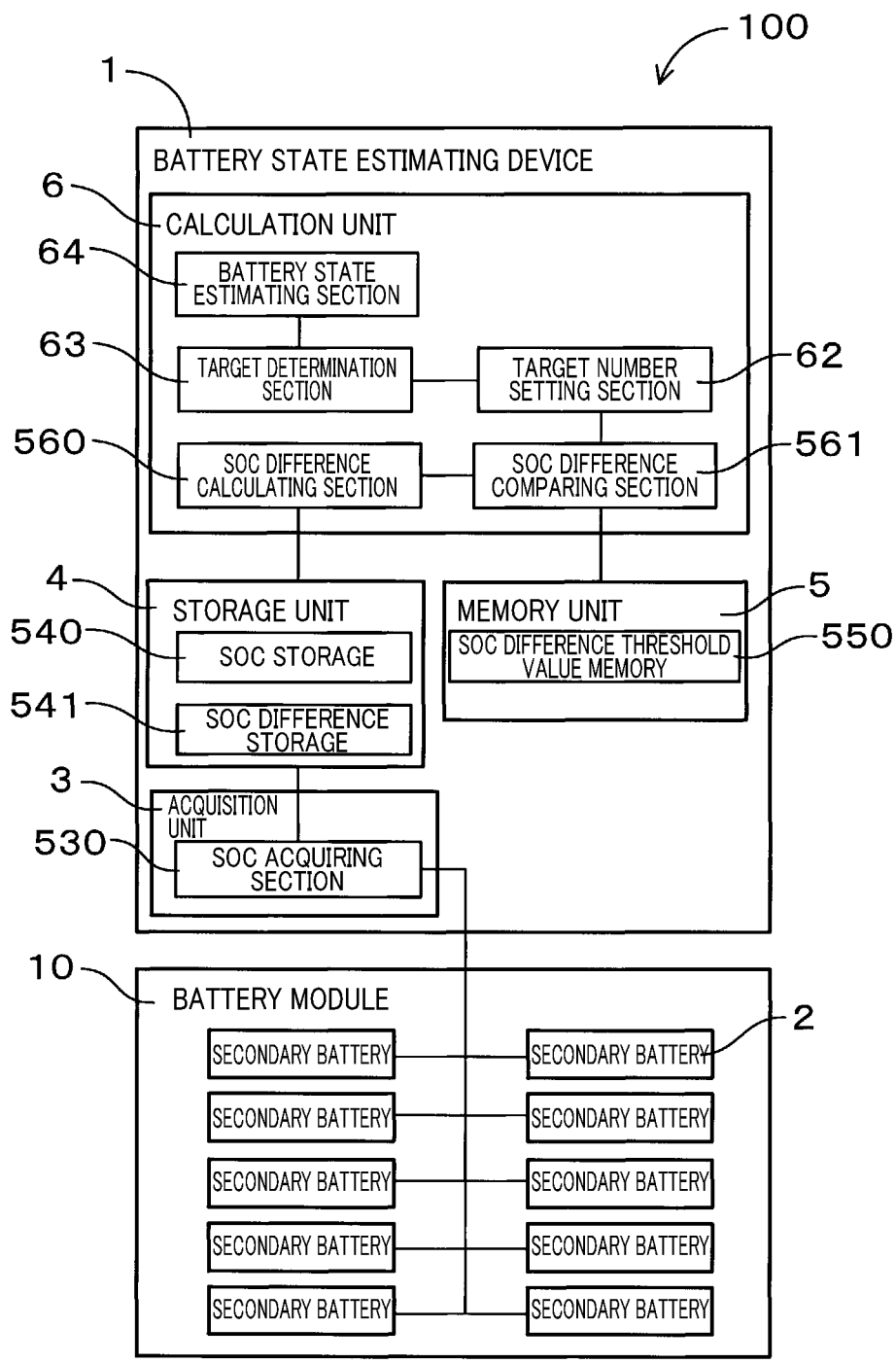
FIG. 10 shows a block diagram of a configuration of a battery state estimating device in a fifth embodiment.

In a battery state estimating device 1 of a fifth embodiment, the battery state estimating device 1 is provided with, as shown in FIG. 10, a SOC acquiring section 530, a SOC storage 540, a SOC difference storage 541, a SOC difference threshold value memory 550, a SOC difference calculating section 560, and a SOC difference comparing section 561 in place of the temperature acquiring section 30, the temperature storage 40, the temperature difference storage 41, the temperature difference threshold value memory 50, the temperature difference calculating section 60 and the temperature difference comparing section 61 of the first embodiment shown in FIG. 1.

Other constituent elements are the same as those in the first embodiment and the same reference numerals as those in the first embodiment are also used in the present embodiment, and the description thereof is omitted.

Then, in the present embodiment, as shown in FIG. 10, the SOC acquiring section 530 acquires the state of charge of the secondary battery 2, that is, the SOC (State Of Charge) as a specific value.

The SOC can derive the battery voltage of the secondary battery 2 based on a SOC-OCV curve showing a relationship between the SOC and an open-circuit voltage stored in advance in a memory (not shown).

Timing for acquiring the SOC is not particularly limited, and it may be performed always or at predetermined intervals.

Note that when the battery module 10 has a plurality of cell blocks formed of a plurality of secondary batteries 2, the SOC acquiring section 530 may acquire the SOC of the cell block detected for each cell block as the SOC of the secondary battery.

As shown in FIG. 10, the storage unit 4 has a SOC storage 540 and a SOC difference storage 541.

The SOC storage 540 is composed of a rewritable nonvolatile memory and stores the SOCs of the plurality of secondary batteries 2 acquired by the SOC acquiring section 530.

Further, the SOC difference storage 541 is also composed of a rewritable nonvolatile memory and stores a SOC difference calculated by the SOC difference calculating section 560 (described later).

As shown in FIG. 10, the memory unit 5 has a SOC difference threshold value memory 550.

The SOC difference threshold value memory 550 is composed of a non-rewritable nonvolatile memory and at least one SOC difference threshold value is stored in advance.

In a case where a plurality of SOC difference threshold values are stored, the plurality of SOC difference threshold values may constitute a predetermined relational formula or map.

Figure 11:
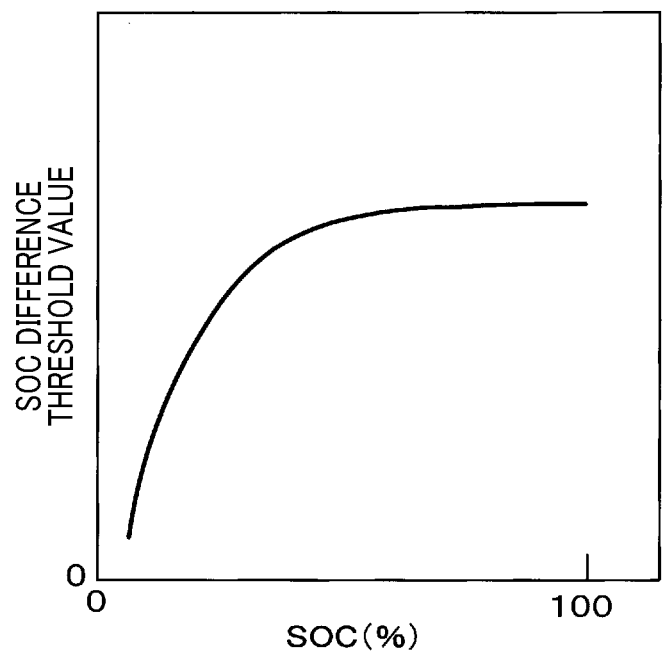
FIG. 11 shows a conceptual diagram of a relationship between a SOC and a SOC difference threshold value in the fifth embodiment.

As shown in FIG. 11, a plurality of SOC difference threshold values are stored in the SOC difference threshold value memory 550 constituting a map defined by the SOC of the secondary battery 2 in the present embodiment.

Note that the form of the map is not limited and the form may be a function of the SOC difference threshold value and the SOC.

Figure 12:
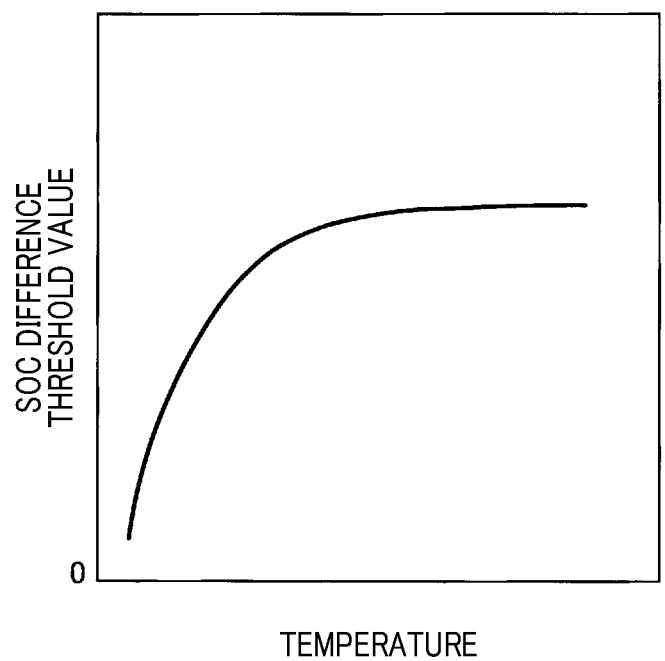
FIG. 12 shows a conceptual diagram of a relationship between the temperature and the SOC difference threshold value in the fifth embodiment.

Further, as shown in FIG. 12, a plurality of SOC difference threshold values may be stored by constructing a map defined by the temperature of the secondary battery 2.

As shown in FIG. 10, the calculation unit 6 includes a SOC difference calculating section 560, a SOC difference comparing section 561, a target number setting section 62, a target determination section 63, and a battery state estimating section 64.

The calculation unit 6 is configured to be capable of executing a program that functions as the SOC difference calculating section 560, the SOC difference comparing section 561, the target number setting section 62, the target determination section 63, and the battery state estimating section 64.

The program is stored in a memory (not shown) provided in the calculation unit 6.

The SOC difference calculating section 560 calculates the SOC difference in the plurality of secondary batteries 2 as a specific value.

In the present embodiment, the SOC difference is the difference between the maximum SOC and the minimum SOC at the predetermined timing of the plurality of secondary batteries 2 stored in the SOC storage 540.

Note that when the battery module 10 has a plurality of cell blocks formed of a plurality of secondary batteries 2, the SOC difference at the temperature of the cell block stored in the SOC storage 540 may be calculated as the SOC difference in the plurality of secondary batteries 2.

The calculated SOC difference is stored in the SOC difference storage 541.

The SOC difference comparing section 561 shown in FIG. 10 extracts the SOC difference stored in the SOC difference storage 541, extracts the SOC difference threshold value stored in the SOC difference threshold value memory 550, and both are compared.

The extraction of the SOC difference threshold value in the SOC difference threshold value memory 550 can be performed based on the SOC stored in the SOC storage 540, and in the present embodiment, for example, when the SOC difference threshold value is stored as the map based on the SOC in the SOC difference threshold value memory 550, as shown in FIG. 11, it is possible to extract a predetermined SOC difference threshold value from the SOC stored in the SOC storage 540.

Further, as shown in FIG. 12, when the SOC difference threshold value is stored as a map based on the temperature, a predetermined SOC difference threshold value can be extracted from the temperature of the secondary battery 2 detected by a temperature sensor (not shown).

Then, the SOC difference comparing section 561 compares the extracted SOC difference threshold value with the SOC difference stored in the SOC difference storage 541.

In the present embodiment, the SOC difference comparing section 561 compares the SOC difference extracted from the SOC storage 540 with the SOC difference threshold value, and indicates a size difference relationship between the SOC difference and the SOC difference threshold value as a comparison result.

The target number setting section 62 shown in FIG. 10 sets the target number, which is the number of secondary batteries 2 estimated by the battery state estimating section 64, based on the comparison result of the SOC difference comparing section 561.

In the present embodiment, when the comparison result of the SOC difference comparing section 561 indicates that the SOC difference is smaller than the SOC difference threshold value, the target number setting section 62 reduces the number of targets.

On the other hand, when the comparison result of the SOC difference comparing section 561 indicates that the SOC difference is not smaller than the SOC difference threshold value, the target number setting section 62 maintains the current target number without reducing the number of targets.

Then, the target determining section 63 determines the secondary battery 2 to be an estimation target based on the target number set by the target number setting section 62 similarly to the case of the first embodiment.

Thereafter, similarly to the case of the first embodiment, the battery state estimating section 64 estimates the battery state of the secondary battery 2 to be the estimation target, which is determined by the target determining section 63.

The state of the battery estimated by the battery state estimating section 64 is not particularly limited, and it is possible to estimate an input/output power, chargeable and dischargeable electric energy, an input/output resistance, and the like in the secondary battery 2.

Next, a use mode of the battery state estimating device 1 of the present embodiment will be described with reference to a flowchart shown in FIG. 13.

Figure 13:
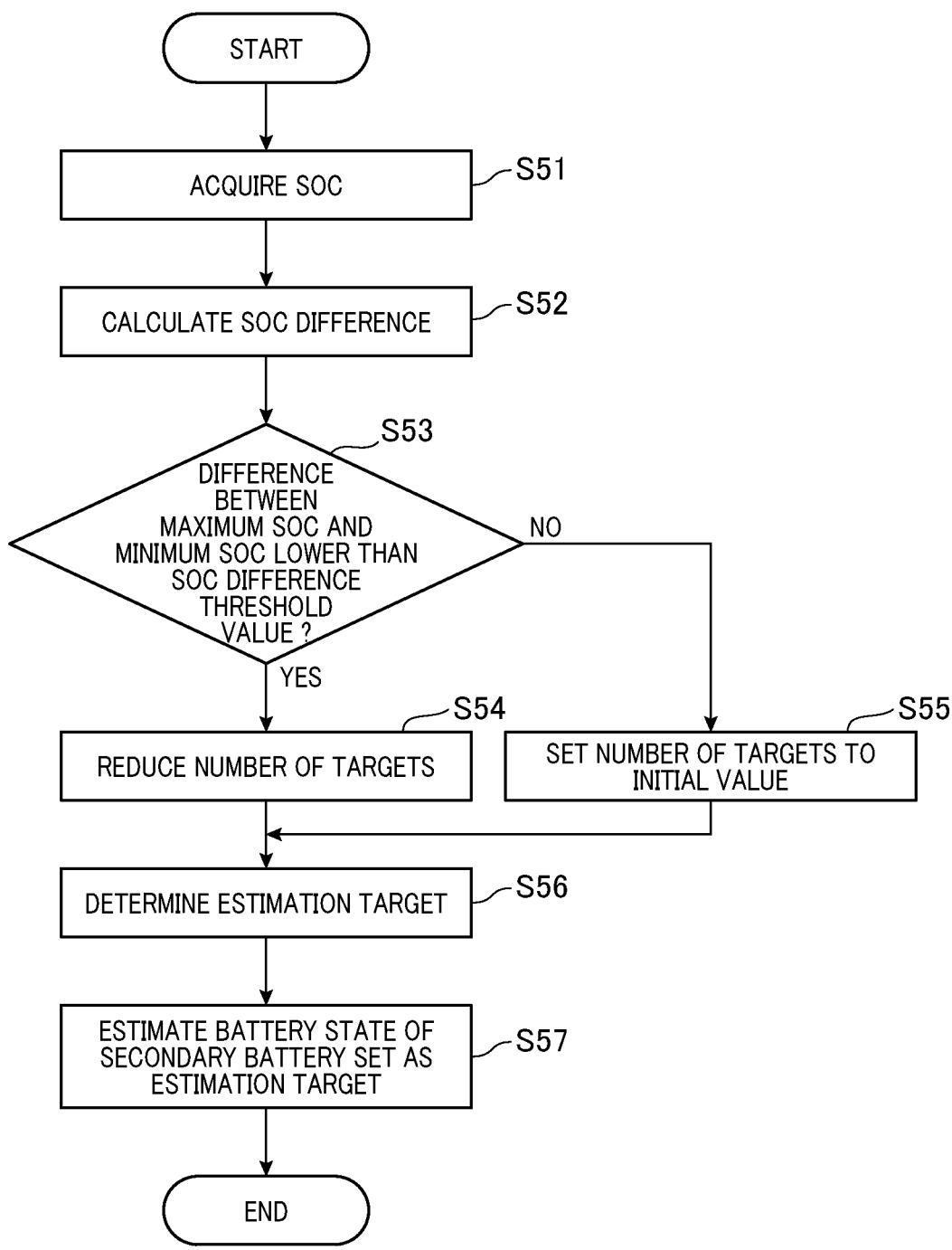
FIG. 13 shows a flowchart of a control mode of the battery state estimating device in the fifth embodiment.

First, as shown in FIG. 13, in step S51, the SOC acquiring section 530 acquires the SOC of the secondary battery 2.

Then, the acquired SOC is stored in the SOC storage 540.

The SOC acquiring section 530 detects the current and the battery voltage of the secondary battery 2 and acquires the SOC in the present embodiment.

Then, in step S52, the SOC difference calculating section 560 calculates the SOC difference, which is the difference between the highest SOC and the lowest SOC, from all SOCs of the secondary batteries 2 stored in the SOC storage 540.

Then, the calculated SOC difference is stored in the SOC difference storage 541.

Thereafter, as shown in FIG. 13, in step S53, first, the SOC difference comparing section 561 extracts the SOC difference stored in the SOC difference memory 541 and the SOC difference stored in the SOC difference threshold value memory 550.

In the present embodiment, the SOC difference threshold value is extracted from the map of the SOC difference threshold value shown in FIG. 12 based on the SOC stored in the SOC storage 540.

Then, the extracted SOC difference and SOC difference threshold value are compared.

The SOC difference comparing section 561 indicates a size difference relationship between the SOC difference and the SOC difference threshold value as a comparison result.

Then, if it is determined in step S53 shown in FIG. 13 that the comparison result of the SOC difference comparing section 561 indicates that the SOC difference is smaller than the SOC difference threshold value, the process proceeds to Yes in step S53, and in step S54, the number setting section 62 reduces the number of targets.

On the other hand, if the comparison result of the SOC difference comparing section 561 indicates that the SOC difference is not smaller than the SOC difference threshold value in step S53, the process proceeds to No in step S53, and in step S55, the target number setting section 62 does not reduce the number of targets, and sets the number of targets as an initial value.

Then, after step S54 or step S55 shown in FIG. 13, in step S56, the target determining section 63 determines a secondary battery 2 to be the estimation target.

In the present embodiment, in a case of after the execution of step S54, the target determining section 63 sets a secondary battery 2 having a low SOC as the estimation target.

On the other hand, in a case of after step S55, all the secondary batteries 2 are set as the estimation targets.

Thereafter, in step S57, the battery state estimating section 64 estimates the battery state of the secondary battery 2 set as the estimation target in the target determining section 63, and ends the process.

Next, functions and effects of the battery state estimating device 1 of the present embodiment will be described in detail.

According to the battery state estimating device 1, it is configured to be able to change the number of targets for estimating the battery state of the plurality of secondary batteries based on the SOC which is the specific value acquired from the secondary battery 2.

As a result, it is possible to control the battery state estimating device so as to reduce the electrical power consumed for the calculation while maintaining the calculation precision.

Further, in the present embodiment, the specific value is configured to be calculated based on the SOC of the secondary battery 2.

Thereby, since the specific value reflects the battery state of the secondary battery 2 reliably, it is possible to appropriately change the calculation amount according to the battery state of the secondary battery 2.

As a result, it is possible to reduce the electrical power consumed for the calculation while maintaining the calculation precision, thereby suppressing heat from being generated.

Further, in the present embodiment, the battery state estimating device 1 includes the SOC acquiring section 530 that acquires the SOC of at least two secondary batteries 2, the SOC difference calculating section 560 that calculates the SOC difference in at least two SOCs acquired by the SOC acquiring section 530 as a specific value, the SOC difference comparing section 561 that compares the SOC difference calculated by the SOC difference calculating section 560 with a preset SOC difference threshold value, the target number setting section 62 that sets the number of targets which is the number of secondary batteries 2 of which the battery states are to be estimated based on the comparison result of the SOC difference comparing section 561, and the battery state estimating section 64 that estimates battery states in secondary batteries corresponding to the number of targets set by the target number setting section 62.

Accordingly, even when the battery module 10 has a large number of secondary batteries 2, since the estimation target is set after setting the number of targets in consideration of the SOC of the secondary battery 2, it is possible to control so as to reduce the power consumption for calculation while maintaining the calculation accuracy.

In addition, in the present embodiment, the target number setting section 62 reduces the number of targets when the comparison result of the SOC difference comparing section 561 indicates that the SOC difference calculated by the SOC difference calculating section 560 is smaller than the SOC difference threshold value.

When the variation in the SOC is small in the plurality of secondary batteries 2, the variation of the battery states in the secondary batteries 2 also becomes small.

Therefore, in the battery module 10 including the plurality of secondary batteries 2, the calculation amount and the power consumption can be reduced while maintaining the estimation accuracy by reducing the estimation target of the battery state when the SOC difference is smaller than the SOC difference threshold value.

Further, in the present embodiment, there is provided the SOC difference threshold value memorys 550 in which a plurality of SOC difference threshold values are stored in advance, and the SOC difference comparing section 561 extracts the SOC difference threshold value from the SOC difference threshold value memory 550 based on the SOC acquired by the SOC acquiring section 530 or the temperature of the secondary battery 2, and the extracted SOC difference threshold value is compared with the SOC difference calculated by the SOC difference calculating section 560.

Thereby, since the SOC difference threshold value for comparison with the SOC difference in the plurality of secondary batteries 2 takes account of the SOC and the temperature of the secondary battery 2, it is possible to extract the SOC difference threshold value corresponding to the variation of the battery state.

As a result, number of estimation targets of the battery state can be reduced when the variation in the battery state of the secondary battery 2 is small, and the calculation amount and the power consumption can be reduced while maintaining the estimation accuracy.

Further, the power supply device 100 includes the above-described battery state estimating device 1 and the battery module 10 having ten or more secondary batteries 2 configured to estimate the battery state by the battery state estimating device 1 in the present embodiment.

Since the power supply device 100 has a large number of secondary batteries 2, it is possible to greatly reduce the amount of calculation and the power consumption while maintaining the estimation accuracy by estimating the battery state by the battery state estimating device 1.

As described above, according to the present embodiment, it is possible to provide the battery state estimating device 1 capable of estimating the battery state of the battery module 10 having a large number of secondary batteries 2 with high accuracy and with low power consumption.

Sixth Embodiment

Figure 14:
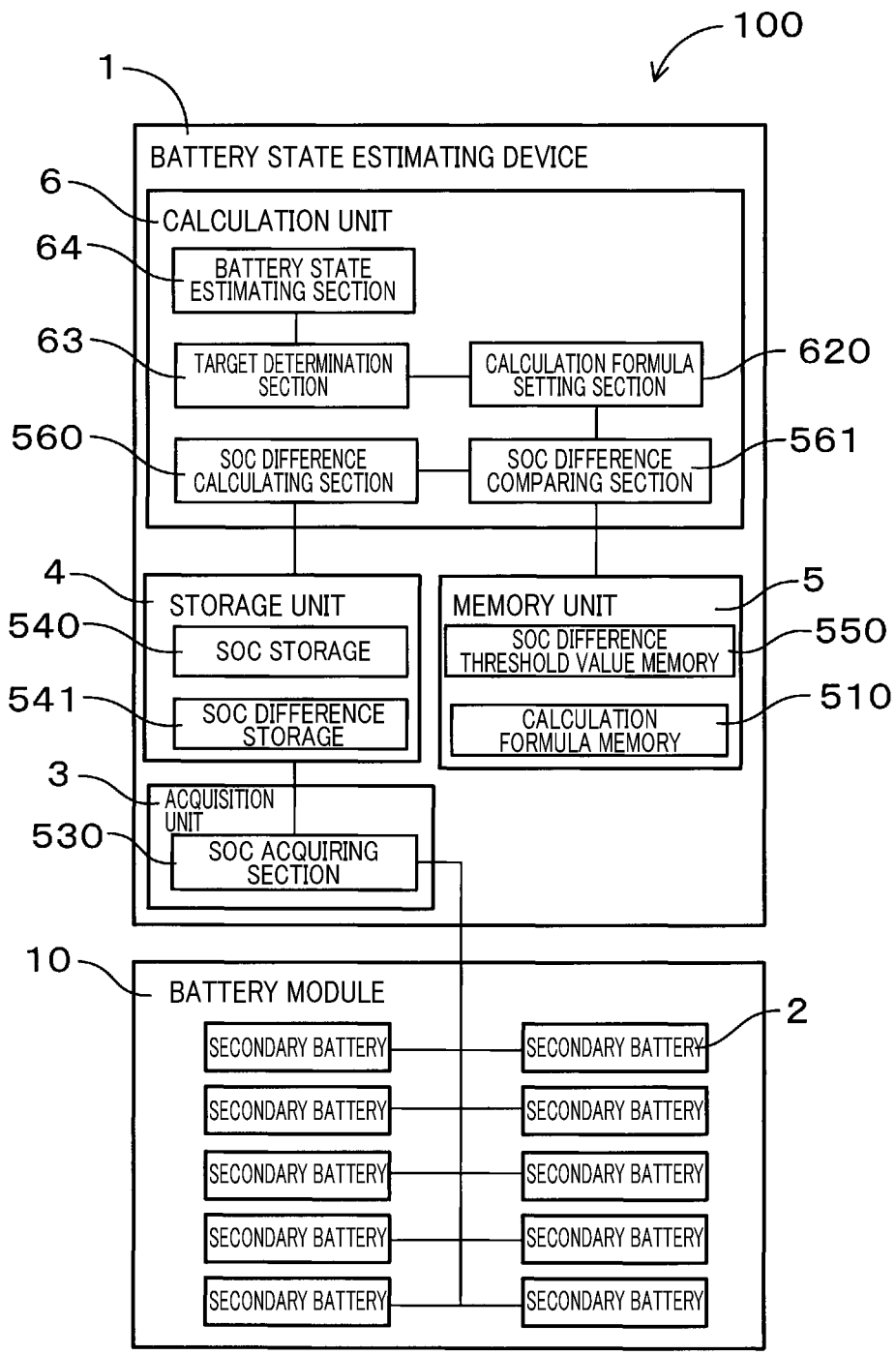
FIG. 14 shows a block diagram of a configuration of a battery state estimating device in a sixth embodiment.

In a battery state estimating device 1 of a sixth embodiment, the battery state estimating device 1 is provided with a calculation formula setting section 620 and an calculation formula memory 510 in the memory unit 5 as shown in FIG. 14 in place of the target number setting section 62 of the fifth embodiment shown in FIG. 10.

Other constituent elements are the same as those in the fifth embodiment, and the same reference numerals as those in the fifth embodiment are also used in the present embodiment, and the description thereof is omitted.

The calculation formula memory 510 shown in FIG. 14 has the same configuration as in the case of the third embodiment.

The calculation formula setting section 620 shown in FIG. 14 sets a calculation formula for estimating the battery state based on the comparison result of the SOC difference comparing section 561.

The calculation formula is extracted from the calculation formula memory 510 by the calculation formula setting section 620.

For example, when the comparison result of the SOC difference comparing section 561 indicates that the SOC difference is smaller than the SOC difference threshold value, the calculation formula setting section 620 extracts a calculation formula with a small calculation load from the calculation formula memory 510, and sets this calculation formula as a calculation formula for estimating the battery state.

When the comparison result of the SOC difference comparing section 561 indicates that the SOC difference is not smaller than the SOC difference threshold value, the calculation formula setting section 620 extracts a calculation formula not having a small calculation load from the calculation formula memory 510, this calculation formula as a calculation formula for estimating the battery state.

Next, a use mode of the battery state estimating device 1 of the present embodiment will be described with reference to a flowchart shown in FIG. 15.

Figure 15:
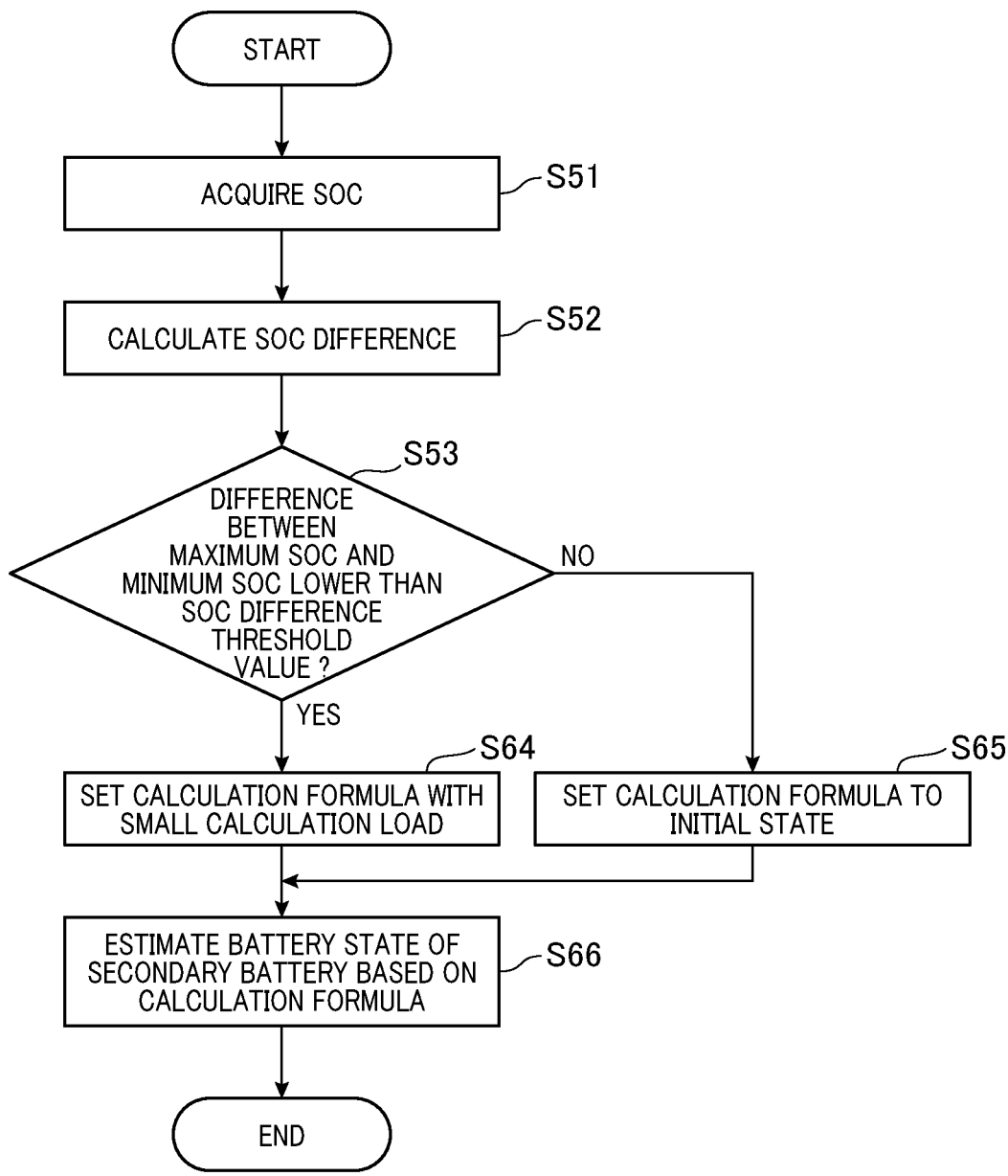
FIG. 15 shows a flowchart of a control mode of the battery state estimating device in the sixth embodiment.

First, as shown in FIG. 15, steps S51 to S53 are the same as the case of the fifth embodiment shown in FIG. 13.

Then, if it is determined in step S53 that the comparison result of the SOC difference comparing section 561 indicates that the SOC difference is smaller than the SOC difference threshold value, the process proceeds to Yes in step S53, and in step S64, the calculation formula setting section 620 extracts a calculation formula with a small calculation load from the calculation formula memory 510 and sets this calculation formula as a calculation formula for estimating the battery state.

On the other hand, if it is determined in step S53 shown in FIG. 15 that the comparison result of the SOC difference comparing section 561 indicates that the SOC difference is not smaller than the SOC difference threshold value, the process proceeds to No in step S53, and in step S65, the calculation formula setting section 620 extracts a calculation formula in an initial state from the calculation formula memory 510 and sets this calculation formula as a calculation formula for estimating the battery state.

Incidentally, the calculation formula in the initial state has a relatively large calculation load.

Then, after step S64 and step S65 shown in FIG. 15, in step S66, the battery state estimating section 64 estimates the battery state of all the secondary batteries 2 based on the set calculation formula, and ends the process.

Functions and effects of the battery state estimating device 1 of the present embodiment will be described in detail below.

The battery state estimating device 1 of the present embodiment is configured to be able to change the calculation formula for estimating the battery state of the plurality of secondary batteries 2 to calculation formula with a small calculation load based on the SOC difference which is the specific value acquired from the secondary battery 2.

As a result, it is possible to control so as to reduce the electrical power consumed for the calculation while maintaining the calculation precision, thereby suppressing heat from being generated.

Further, in the present embodiment, the battery state is estimated using a calculation formula with a small calculation load when the SOC difference of the secondary battery 2 as the specific value is smaller than the SOC difference threshold value.

As a result, since the change in the battery state is small when the SOC difference is small, it is possible to reduce the power consumption while maintaining the calculation precision by suppressing the estimation accuracy from dropping by using the calculation formula with a small calculation load when the SOC difference is small, thereby suppressing heat from being generated.

Further, in the present embodiment, similar to the fifth embodiment, the SOC difference comparing section 561 includes the SOC difference threshold value memory 550 in which a plurality of SOC difference threshold values are stored in advance, and the SOC difference comparing section 561 extracts the SOC difference threshold value from the SOC difference threshold value memory 550 based on the SOC acquired by the SOC acquiring section 530 or temperature of the secondary battery 2, and compares the extracted SOC difference threshold value with the SOC difference calculated by the SOC difference calculating section 560.

As a result, since the SOC difference threshold value for comparison with the SOC difference in the plurality of secondary batteries 2 takes account of the SOC and the temperature of the secondary battery 2, it is possible to extract the SOC difference threshold value corresponding to the variation in the battery state.

As a result, number of estimation targets of the battery state can be reduced when the variation in the battery state of the secondary battery 2 is small, and the calculation amount and the power consumption can be reduced while maintaining the estimation accuracy, thereby suppressing heat from being generated.

Seventh Embodiment

Figure 16:
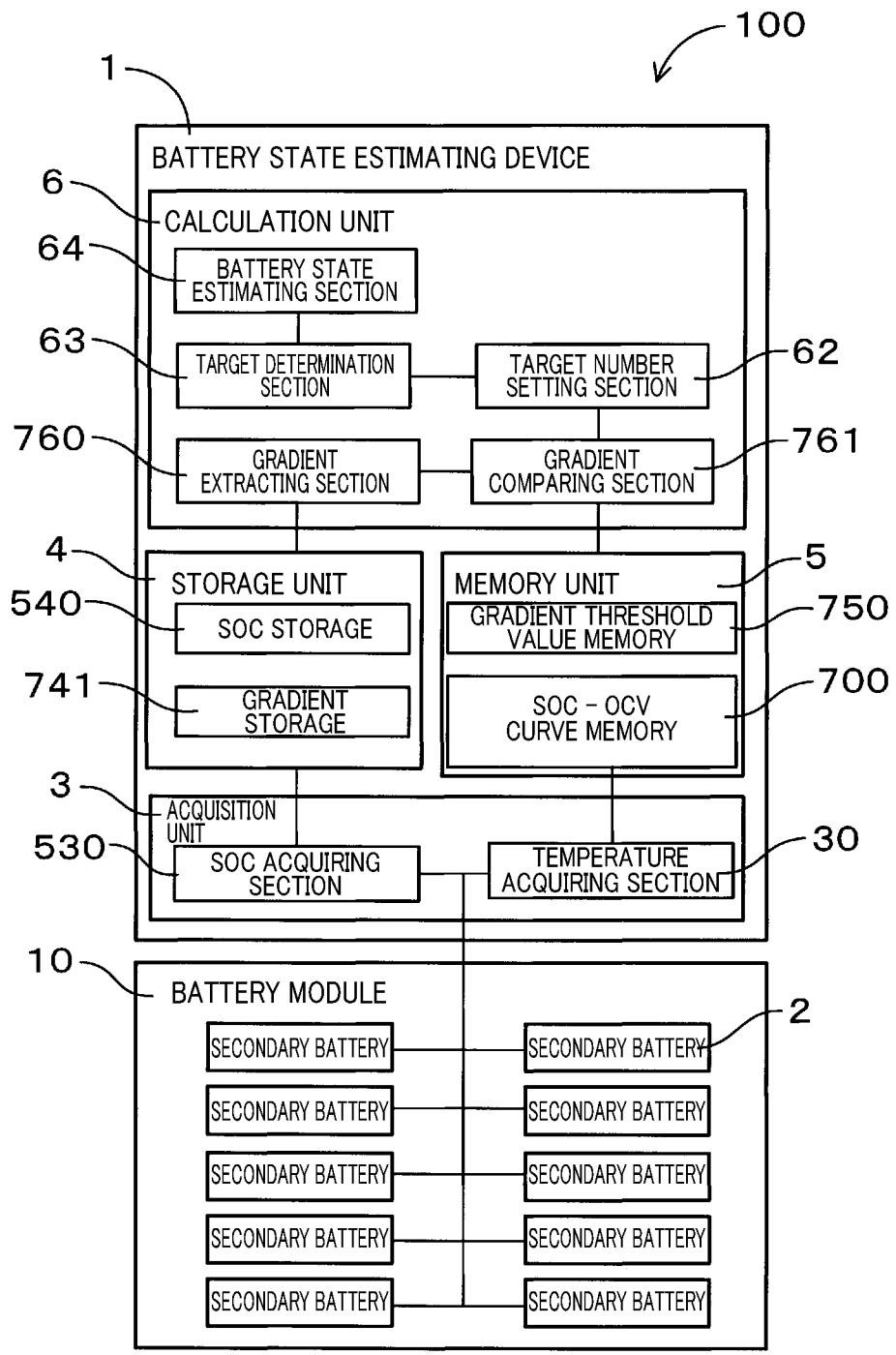
FIG. 16 shows a block diagram of a configuration of a battery state estimating device in a seventh embodiment.

In a battery state estimating device 1 of a seventh embodiment, the battery state estimating device 1 is provided with a SOC-OCV curve memory 700, a gradient storage 741, a gradient threshold value memory 750, a gradient extracting section 760, and the gradient comparing section 761 as shown in FIG. 16 in place of the SOC difference storage 541, the SOC difference threshold value memory 550, the SOC difference calculating section 560, and the SOC difference comparing section 561 of the fifth embodiment shown in FIG. 10.

Furthermore, the temperature acquiring section 30 is provided.

Other constituent elements are the same as those in the fifth embodiment, and the same reference numerals as those in the fifth embodiment are also used in the present embodiment, and the description thereof is omitted.

A SOC-OCV curve indicating a correspondence relationship between the SOC in the secondary battery 2 and the OCV which is an open voltage is stored in the SOC-OCV curve memory 700 shown in FIG. 16 in advance.

Figure 17:
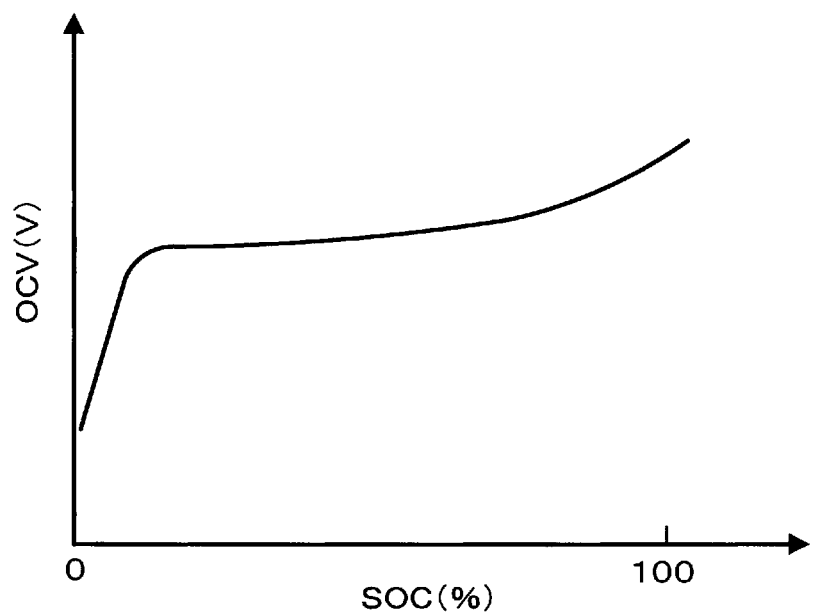
FIG. 17 shows a conceptual diagram of a SOC-OCV curve in the seventh embodiment.

For example, the SOC-OCV curve shown in FIG. 17 is stored in the SOC-OCV curve memory 700.

The SOC-OCV curve stored in the SOC-OCV curve memory 700 can be appropriately selected according to the type and configuration of the secondary battery 2 to be used.

The gradient extracting section 760 shown in FIG. 16 extracts a gradient of the SOC-OCV curve from the SOC-OCV curve stored in the SOC-OCV curve memory 700 based on the SOC acquired by the SOC acquiring section 530 as a specific value.

The gradient of the SOC-OCV curve is a gradient of a tangent to the SOC-OCV curve in the SOC at the time of estimating the state.

Note that when the battery module 10 has the plurality of cell blocks formed of the plurality of secondary batteries 2, the SOC-OCV curve can be extracted from the SOC-OCV curve stored in the OCV curve memory 700 by using the SOC of the cell block stored in the SOC storage 540 as the SOC of the plurality of secondary batteries 2.

The extracted gradient is stored in the gradient storage 741.

The gradient comparing section 761 shown in FIG. 16 extracts the gradient stored in the gradient storage 741, extracts the gradient threshold value stored in the gradient threshold value memory 750, and both are compared.

The extraction of the gradient threshold value in the gradient threshold value memory 750 can be performed based on the temperature of the secondary battery 2 acquired by the temperature acquiring section 30.

Figure 18:
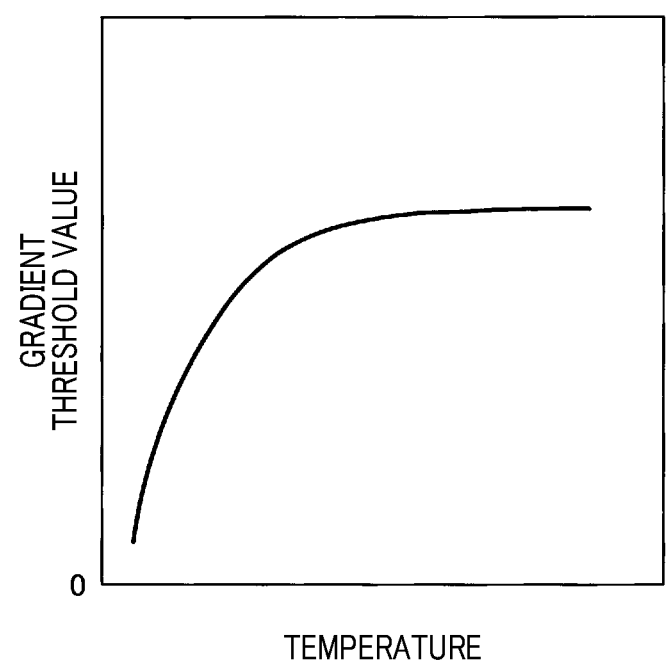
FIG. 18 shows a conceptual diagram of a relationship between the temperature and a gradient threshold in the seventh embodiment.

In the present embodiment, for example, in a case where a gradient threshold value is stored as a map based on temperature as shown in FIG. 18 in the gradient threshold value memory 750, the gradient comparing section 761 can extract a predetermined gradient threshold value from the temperature of the secondary battery 2 acquired by the temperature acquiring section 30.

Then, the gradient comparing section 761 compares the extracted gradient threshold value with the gradient stored in the gradient storage 741.

In the present embodiment, the gradient comparing section 761 compares the gradient stored in the gradient storage 741 with the gradient threshold value, and indicates s size difference relation between the gradient and the gradient threshold value as a comparison result.

The target number setting section 62 shown in FIG. 16 sets the number of targets, which is the number of secondary batteries 2 estimated by the battery state estimating section 64, based on the comparison result calculated by the temperature difference comparing section 61.

In the present embodiment, when the comparison result of the gradient comparing section 761 indicates that the gradient is smaller than the gradient threshold value, the target number setting section 62 reduces the number of targets.

On the other hand, when the comparison result of the gradient comparing section 761 indicates that the gradient is not smaller than the gradient threshold value, the target number setting section 62 maintains the current target number without reducing the number of targets.

Then, the target determining section 63 determines the secondary battery 2 to be an estimation target based on the target number set by the target number setting section 62 similarly to the case of the first embodiment.

Thereafter, similarly to the case of the first embodiment, the battery state estimating section 64 estimates the battery state of the secondary battery 2 to be the estimation target, which is determined by the target determining section 63.

The state of the battery estimated by the battery state estimating section 64 is not particularly limited, and it is possible to estimate an input/output power, chargeable and dischargeable electric energy, an input/output resistance, and the like in the secondary battery 2.

Next, a use mode of the battery state estimating device 1 of the present embodiment will be described with reference to a flowchart shown in FIG. 19.

Figure 19:
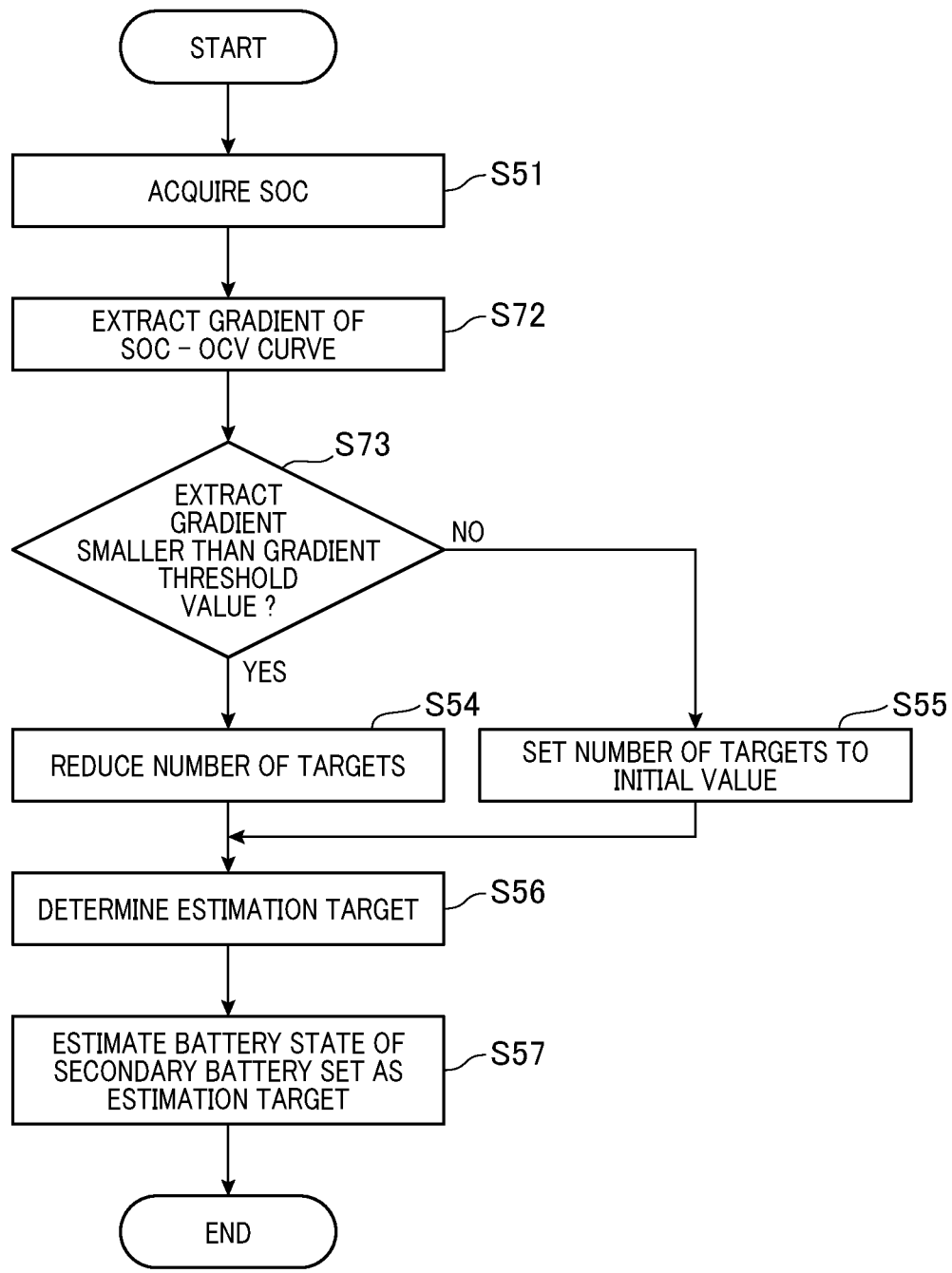
FIG. 19 shows a flowchart of a control mode of the battery state estimating device in the seventh embodiment.

First, as shown in FIG. 19, similarly to the case of the fifth embodiment, in step S51, the SOC acquiring section 530 acquires the SOC of the secondary battery 2.

Then, the acquired SOC is stored in the SOC storage 540.

Thereafter, in step S72, the gradient extracting section 760 extracts the gradient of the SOC-OCV curve from the SOC stored in the SOC storage 540.

Then, the extracted gradient is stored in the gradient storage 741.

Thereafter, as shown in FIG. 19, in step S73, the gradient comparing section 761 first extracts the gradient stored in the gradient memory 740 and extracts the gradient threshold value stored in the gradient threshold value memory 750.

In the present embodiment, the gradient threshold value is extracted from the gradient threshold value map shown in FIG. 18 based on the temperature of the secondary battery 2 acquired by the temperature acquiring section 30.

Then, the gradient comparing section 761 compares the extracted gradient with the gradient threshold value, and indicates a size difference relation between the gradient and the gradient threshold as a comparison result.

Then, if it is determined in step S73 shown in FIG. 19 that the comparison result of the gradient comparing section 761 indicates that the gradient is smaller than the gradient threshold value, the process proceeds to Yes in step S73, and in step S54, the target number setting section 62 reduces the number of targets.

On the other hand, if the comparison result of the gradient comparing section 761 indicates that the gradient is not smaller than the gradient threshold value in step S53, the process proceeds to No in step S73, and in step S55, the target number setting section 562 does not reduce the number of targets, and sets the number of targets as an initial value.

Then, after step S54 or step S55 shown in FIG. 19, in step S56, the target determining section 63 determines a secondary battery 2 to be the estimation target.

In the present embodiment, in a case of after the execution of step S54, the target determining section 63 sets a secondary battery 2 having a small gradient as the estimation target.

On the other hand, in a case of after step S55, all the secondary batteries 2 are set as the estimation targets.

Thereafter, in step S57, the battery state estimating section 64 estimates the battery state of the secondary battery 2 set as the estimation target in the target determining section 63, and ends the process.

Next, functions and effects of the battery state estimating device 1 of the present embodiment will be described in detail.

According to the battery state estimating device 1, it is configured to be able to change the number of targets for estimating the battery state of the plurality of secondary batteries 2 based on the gradient of the SOC-OCV curve extracted from the SOC as the specific value acquired from the secondary battery 2.

As a result, it is possible to control so as to reduce the electrical power consumed for the calculation while maintaining the calculation precision, thereby suppressing heat from being generated.

In addition, in the present embodiment, the target number setting section 62 reduces the number of targets when the comparison result of the gradient comparing section 761 indicates that the gradient extracted by the gradient extracting section 760 is smaller than the gradient threshold value.

When the gradient of the SOC-OCV curve is small, that is, when the change amount of the OCV with respect to the SOC is small in the plurality of secondary batteries 2, the variation of the battery state in the secondary battery 2 also becomes small.

Therefore, as described above, in the battery module including the plurality of secondary batteries 2, the calculation amount and the power consumption can be reduced while maintaining the estimation accuracy thereby suppressing heat from being generated by reducing the estimation target of the battery state when the gradient of the SOC-OCV curve of the secondary battery 2 is small.

Further, according to the present embodiment, there is provided the temperature acquiring section 30 that acquires the temperature of the secondary battery 2 and the gradient threshold value memory 750 that stores the plurality of gradient threshold values in advance, and the gradient comparing section 761 extracts the gradient threshold value from the gradient threshold value memory 750 based on the temperature acquired by the temperature acquiring section 30, and compares the extracted gradient threshold value with the gradient extracted by the gradient extracting section 760.

Thereby, since the gradient threshold for comparison with the gradient of the SOC-OCV curve in the plurality of secondary batteries 2 takes account of the temperature of the secondary battery 2, it is possible to extract the gradient threshold value corresponding to the variation of the battery state.

As a result, number of estimation targets of the battery state can be reduced when the variation in the battery state of the secondary battery 2 is small, and the calculation amount and the power consumption can be reduced while maintaining the estimation accuracy, thereby suppressing heat from being generated.

Eighth Embodiment

Figure 20:
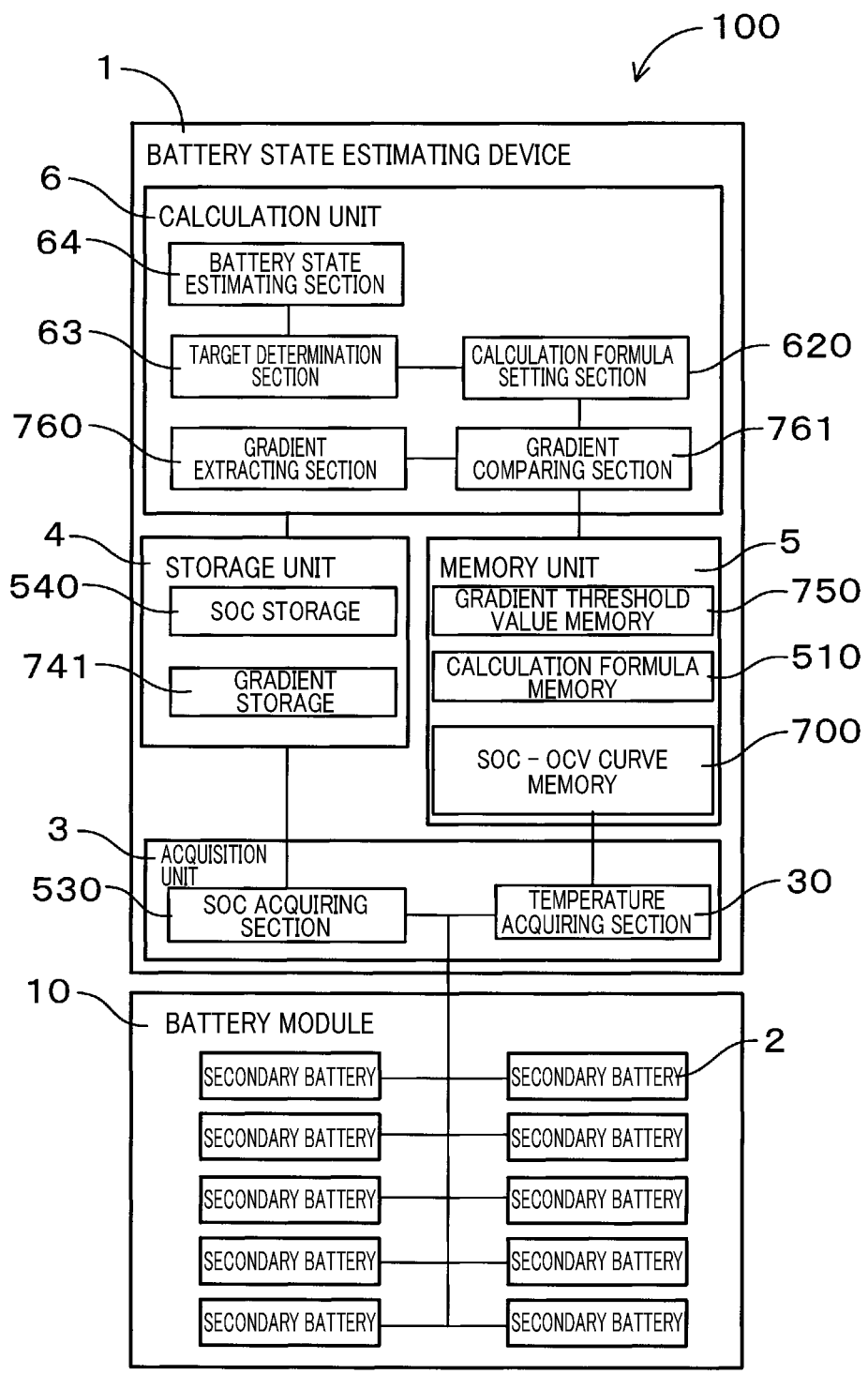
FIG. 20 shows a block diagram of a configuration of a battery state estimating device in an eighth embodiment.

In a battery state estimating device 1 of an eighth embodiment, the battery state estimating device 1 is provided with a calculation formula setting section 620 and an calculation formula memory 510 in the memory unit 5 as shown in FIG. 20 in place of the target number setting section 62 of the seventh embodiment shown in FIG. 16.

Other constituent elements are the same as those in the seventh embodiment, and the same reference numerals as those in the seventh embodiment are also used in the present embodiment, and the description thereof is omitted.

The calculation formula memory 510 has the same configuration as in the case of the third embodiment.

The calculation formula setting section 620 sets a calculation formula for estimating the battery state based on the comparison result of the gradient comparing section 761.

The calculation formula is extracted from the calculation formula memory 510 by the calculation formula setting section 620.

For example, in a case where the comparison result of the gradient comparing section 761 indicates that the gradient is larger than the gradient threshold value, the calculation formula setting section 620 extracts a calculation formula with a small calculation load from the calculation formula memory 510, and sets this calculation formula as a calculation formula for estimating the battery state.

When the comparison result of the gradient comparing section 761 indicates that the gradient is not larger than the gradient threshold value, the calculation formula setting section 620 extracts a calculation formula not having a small calculation load from the calculation formula memory 510, and sets this calculation formula as a calculation formula for estimating the battery state.

Next, a use mode of the battery state estimating device 1 of the present embodiment will be described with reference to a flowchart shown in FIG. 21.

Figure 21:
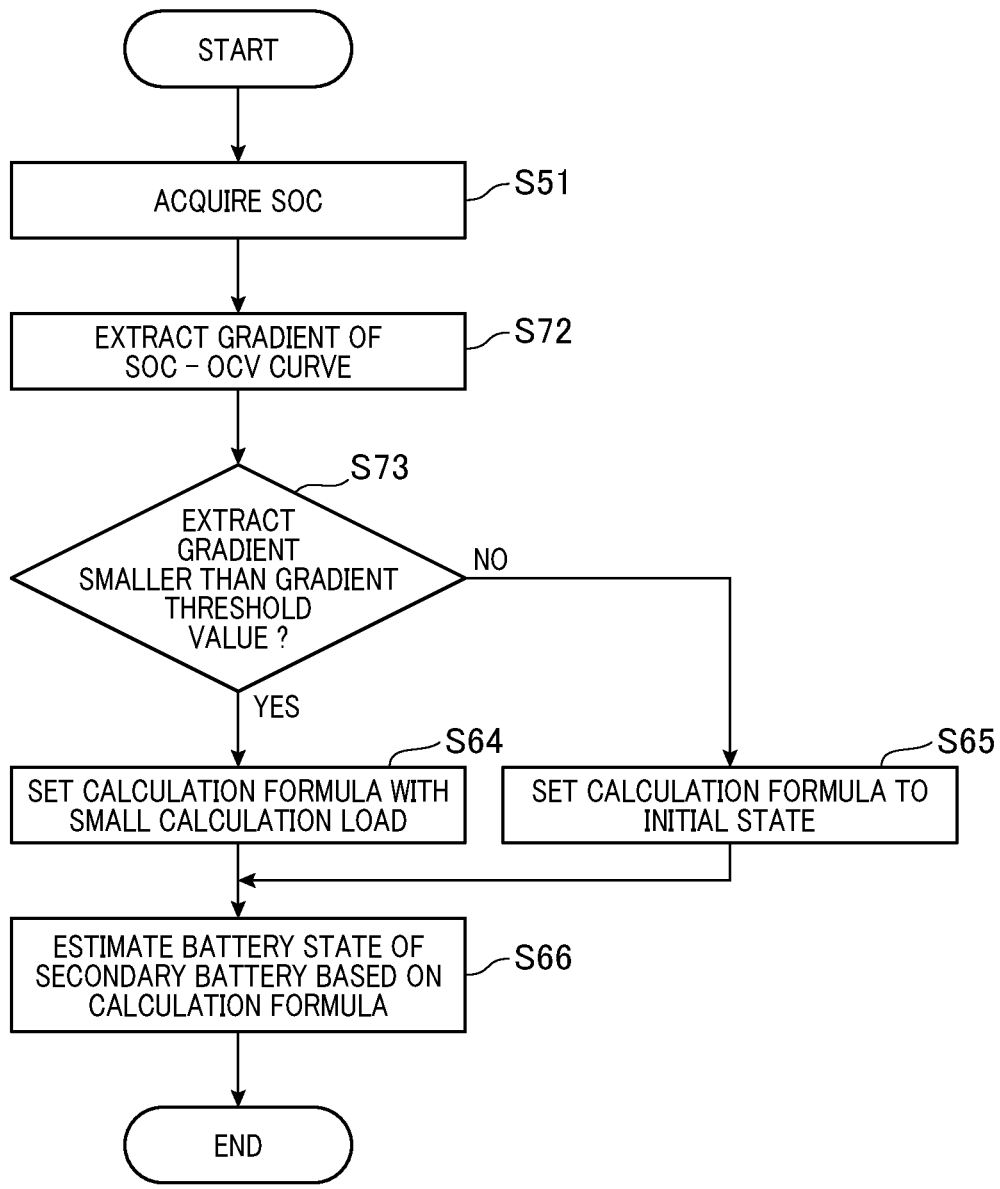
FIG. 21 shows a flowchart of a control mode of the battery state estimating device in the eighth embodiment.

First, as shown in FIG. 21, steps S51, S72, and S73 are the same as the case of the seventh embodiment shown in FIG. 19.

Then, if it is determined in step S73 that the comparison result of the gradient comparing section 761 indicates that the gradient is smaller than the gradient threshold value, the process proceeds to Yes in step S73, and in step S64, the calculation formula setting section 620 extracts a calculation formula with a small calculation load from the calculation formula memory 510 and sets this calculation formula as a calculation formula for estimating the battery state.

On the other hand, if it is determined in step S73 shown in FIG. 21 that the comparison result of the gradient comparing section 761 indicates that the gradient is not smaller than the gradient threshold value, the process proceeds to No in step S73, and in step S65, the calculation formula setting section 620 extracts a calculation formula in an initial state from the calculation formula memory 510 and set this calculation formula as a calculation formula for estimating the battery state.

Incidentally, the calculation formula in the initial state has a relatively large calculation load.

Then, after step S64 and step S65 shown in FIG. 21, in step S66, the battery state estimating section 64 estimates the battery state of all the secondary batteries 2 based on the set calculation formula, and ends the process.

Functions and effects of the battery state estimating device 1 of the present embodiment will be described in detail below.

The battery state estimating device 1 of the present embodiment is configured to be able to change the calculation formula for estimating the battery state of the plurality of secondary batteries 2 to calculation formula with a small calculation load based on the gradient of the SOC-OCV curve extracted from the SOC which is the specific value acquired from the secondary battery 2.

As a result, it is possible to control so as to reduce the electrical power consumed for the calculation while maintaining the calculation precision, thereby suppressing heat from being generated.

Further, in the present embodiment, in a case where the comparison result of the gradient comparing section 761 indicates that the gradient extracted by the gradient extracting section 760 is smaller than the gradient threshold value, the calculation formula setting section 620 sets a calculation formula with little calculation load as a calculation formula.

When the gradient of the SOC-OCV curve is small, that is, when the change amount of the OCV with respect to the SOC is small in the plurality of secondary batteries 2, the variation of the battery state in the secondary battery 2 also becomes small.

Therefore, as described above, in the battery module 10 including the plurality of secondary batteries 2, the calculation amount and the power consumption can be reduced while maintaining the estimation accuracy thereby suppressing heat from being generated by setting a calculation formula with a small calculation load when the gradient of the SOC-OCV curve of the secondary battery 2 is small.

Moreover, in the present embodiment, as in the case of the seventh embodiment, the battery state estimating device 1 is provided with the temperature acquiring section 30 that acquires the temperature of the secondary battery 2 and the gradient threshold value memory 750 that stores the plurality of gradient threshold values in advance, and the gradient comparing section 761 extracts the gradient threshold value from the gradient threshold value memory 750 based on the temperature acquired by the temperature acquiring section 30, and compares the extracted gradient threshold value with the gradient extracted by the gradient extracting section 760.

Thereby, since the gradient threshold for comparison with the gradient of the SOC-OCV curve in the plurality of secondary batteries 2 takes account of the temperature of the secondary battery 2, it is possible to extract the gradient threshold value corresponding to the variation of the battery state.

As a result, number of estimation targets of the battery state can be reduced when the variation in the battery state of the secondary battery 2 is small, and the calculation amount and the power consumption can be reduced while maintaining the estimation accuracy, thereby suppressing heat from being generated.

The present disclosure is not limited to each of the above-described embodiments, and can be applied to various embodiments without departing from the scope thereof.

For example, by having the temperature difference in the first embodiment and the temperature in the third embodiment being combined to be the specific value, by reducing the estimation target of the battery state, and by changing the calculation formula to a calculation formula with little calculation load, the power may be suppressed from being consumed by reducing the calculation amount while maintaining the estimation accuracy.

In addition, by having the temperature difference in the first embodiment and the SOC in the sixth embodiment being combined to be the specific value, by reducing the estimation target of the battery state, and by changing the calculation formula to a calculation formula with little calculation load, the power may be suppressed from being consumed by reducing the calculation amount while maintaining the estimation accuracy.

Further, the configuration of the change determination section 67 that determines whether or not to change the number of targets based on the comparison result of the voltage difference comparing section 66 in the second embodiment may be applied to the fifth and sixth embodiments.

Furthermore, the configuration of the change determination section 67 that determines whether or not to change the setting of the calculation formula based on the comparison result of the voltage difference comparing section 66 in the fourth embodiment may be applied to the seventh and eighth embodiments.

What is claimed is:
1. A battery state estimating device comprising:
a battery module;
a plurality of secondary batteries in the battery module;
a temperature acquiring section that acquires temperatures of at least two of the secondary batteries;
a temperature difference comparing section that compares the temperature difference of at least two temperatures acquired h the temperature acquiring section as a specific value;
a temperature difference comparing section that compares the temperature difference calculated by the temperature difference calculating section with a preset temperature difference threshold value;
a target number setting section that sets the number of targets based on a comparison result calculated by the temperature difference comparing section; and a battery state estimating section that estimates the battery states of the secondary batteries in the number corresponding to the target number set by the target number setting section;
the battery state estimating device being configured to:
estimate a battery state of the battery module; and
be able to change a number of targets which is a number of the secondary batteries subject to estimation of a battery state of the plurality of secondary batteries based on the specific value; or
be able to change a calculation formula for estimating the battery state of the battery module to a calculation formula with a smaller calculation load,
wherein the target number setting section reduces the number of targets when the comparison result calculated by the temperature difference comparing section indicates that the temperature difference calculated by the temperature difference calculating section is smaller than the temperature difference threshold value.

2. The battery state estimating device according to claim 1, wherein the specific value is calculated based on a SOC which is a state of charge of the plurality of secondary batteries.

3. The battery state estimating device according to claim 2, further comprising:
a SOC acquiring section that acquires a SOC of the secondary battery;
a SOC-OCV curve memory in which a SOC-OCV curve showing a correspondence relationship between the SOC in the secondary battery and an OCV as an open voltage is stored in advance;
a gradient extracting section that extracts a gradient of the SOC-OCV curve from the SOC-OCV curve stored in the SOC-OCV curve memory based on the SOC acquired by the SOC acquiring section as the specific value;
a gradient comparing section that compares a gradient extracted by the gradient extracting section with a preset gradient threshold value;
an target number setting section that sets a number of targets based on a comparison result of the gradient comparing section; and
a battery state estimating section that estimates battery states of the secondary batteries in a number corresponding to the target number set by the target number setting section;
wherein the target number setting section reduces the target number when a comparison result of the gradient comparing section indicates that a gradient extracted by the gradient extracting section is smaller than the gradient threshold value.

4. The battery state estimating device according to claim 3, further comprising:
a gradient threshold value memory in which a plurality of gradient threshold values are stored in advance;
wherein the gradient comparing section extracts the gradient threshold value from the gradient threshold value memory based on the temperature acquired by the temperature acquiring section, and compares the extracted gradient threshold value with the gradient extracted by the gradient extracting section.

5. The battery state estimating device according to claim 2, further comprising:
a SOC acquiring section that acquires SOCs of at least two of the secondary batteries;
a SOC difference calculating section that calculates a difference between at least two SOCs acquired by the SOC acquiring section as the specific value;
a SOC difference comparing section that compares the SOC difference calculated by the SOC difference calculating section with a preset SOC difference threshold value;
a calculation formula setting section that sets a calculation formula for estimating the battery state based on a comparison result of the SOC comparing section; and
a battery state estimating section that estimates a battery state of the secondary battery based on the calculation formula set by the calculating formula setting section;
wherein the calculation formula setting section sets a calculation formula with a small calculation load as the calculation formula in a case where the comparison result of the SOC difference comparing section indicates that the SOC difference calculated by the SOC difference calculating section is smaller than the SOC difference threshold value.

6. The battery state estimating device according to claim 2, further comprising:
a SOC acquiring section that acquires a SOC of the secondary battery;
a SOC-OCV curve memory in which a SOC-OCV curve showing a correspondence relationship between the SOC in the secondary battery and an OCV as an open voltage is stored in advance;
a gradient extracting section that extracts a gradient of the SOC-OCV curve from the SOC-OCV curve stored in the SOC-OCV curve memory based on the SOC acquired by the SOC acquiring section as the specific value;
a gradient comparing section that compares a gradient extracted by the gradient extracting section with a preset gradient threshold value;
a calculation formula setting section that sets a calculation formula for estimating the battery state based on a comparison result of the gradient comparing section; and
a battery state estimating section that estimates a battery state of the secondary battery based on the calculation formula set by the calculating formula setting section;
wherein the calculation formula setting section sets a calculation formula with a small calculation load as the calculation formula when a comparison result of the gradient comparing section indicates that the gradient extracted by the gradient extracting section is smaller than the gradient threshold value.

7. The battery state estimating device according to claim 1, further comprising:
a temperature comparing section that compares one of the temperatures acquired by the temperature acquiring section with a preset temperature threshold value;
a calculation formula setting section that sets a calculation formula for estimating the battery state based on a comparison result of the temperature comparing section; and
wherein the battery state estimating section estimates the battery states of the secondary batteries based on the calculation formula set by the calculating formula setting section; and
the calculation formula setting section sets a calculation formula with a small calculation load as the calculation formula in a case where the comparison result of the temperature comparing section indicates that the temperature acquired by the temperature acquiring section is larger than the temperature threshold value.

8. The battery state estimating device according to claim 7, further comprising:
a voltage value acquiring section that acquires terminal voltages of the plurality of secondary batteries;
a voltage difference calculating section that calculates a voltage difference from a plurality of voltage values acquired by the voltage value acquiring section;
a voltage difference comparing section that compares the voltage difference calculated by the voltage difference calculating section with a preset voltage difference threshold value; and
a change determination section that determines whether or not to change the setting of the calculation formula based on a comparison result of the voltage difference comparing section;
wherein the calculation formula setting section changes the setting of the calculation formula based on a determination result of the change determination section.

9. The battery state estimating device according to claim 1, further comprising:
a temperature difference threshold value memory in which a plurality of the temperature difference threshold values are stored in advance,
wherein the temperature difference comparing section extracts the temperature difference threshold value from the temperature difference threshold value memory based on any one of at least two temperatures acquired by the temperature acquiring section, and compares the extracted temperature difference threshold value with the temperature difference calculated by the temperature difference calculating section.

10. The battery state estimating device according to claim 1, further comprising:
a voltage value acquiring section that acquires terminal voltages of the plurality of secondary batteries;
a voltage difference calculating section that calculates a voltage difference from the plurality of voltage values acquired by the voltage value acquiring section;
a voltage difference comparing section that compares the voltage difference calculated by the voltage difference calculating section with a preset voltage difference threshold value; and
a change determination section that determines whether or not to change the number of targets based on a comparison result of the voltage difference comparing section;
wherein the target number setting section changes the number of targets based on a determination result of the change determination section.

11. A battery state estimating device comprising:
a battery module;
a plurality of secondary batteries in the battery module;
a SOC acquiring section that acquires SOCs of at least two of the secondary batteries;
a SOC difference calculating section that calculates a difference between at least two SOCs acquired by the SOC acquiring section as a specific value;
a SOC difference comparing section that compares the SOC difference calculated by the SOC difference calculating section with a preset SOC difference threshold value;
a target number setting section that sets the number of targets based on a comparison result of the SOC difference comparing section; and
a battery state estimating section that estimates battery states of the secondary batteries in a number corresponding to the target number set by the target number setting section;
the batter state estimating device being configured to;
estimate a battery state of the battery module; and
be able to change a number of targets which is a number of the secondary batteries subject to estimation of a battery state of the plurality of secondary batteries based on the specific value; or
be able to change a calculation formula for estimating the battery state of the battery module to a calculation formula with a smaller calculation load,
wherein the target number setting section reduces the number of targets when a comparison result of the SOC difference comparing section indicates that the difference of the SOC calculated by the SOC difference calculating section is smaller than the SOC difference threshold value.

12. The battery state estimating device according to claim 11, further comprising:
a SOC difference threshold value memory in which a plurality of SOC difference threshold values are stored in advance,
wherein the SOC difference comparing section extracts the SOC difference threshold value from the SOC difference threshold value memory based on the SOC acquired by the SOC acquiring section or the temperature of the secondary battery, and compares the extracted SOC difference threshold value with the SOC difference calculated by the SOC difference calculating section.

13. A power supply device comprising:
a battery state estimating device;
a battery module having ten or more secondary batteries of which battery states are configured to be estimated by the battery state estimating device;
a temperature acquiring section that acquires temperatures of at least two of the secondary batteries;
a temperature difference calculating section that calculates a temperature difference of at least two temperatures acquired by the temperature acquiring section as a specific value;
a temperature difference comparing section that compares the temperature difference calculated by the temperature difference calculating section with a preset temperature difference threshold value;
a target number setting section that sets the number of targets based on a comparison result calculated by the temperature difference comparing section; and
a battery state estimating section that estimates the battery states of the secondary batteries in the number corresponding to the target number set by the target number setting section;
the battery state estimating device being configured to:
be able to change a number of targets which is a number of the secondary batteries subject to estimation of the battery state of the secondary battery based on the specific value; or
be able to change a calculation formula for estimating the battery state of the battery to a calculation formula with a small calculation load,
wherein the target number setting section reduces the number of targets when the comparison result calculated by the temperature difference comparing section indicates that the temperature difference calculated by the temperature difference calculating section is smaller than the temperature difference threshold value.

* * * * *